United States Patent [19]
Aubel et al.

[11] Patent Number: 5,696,693
[45] Date of Patent: Dec. 9, 1997

[54] METHOD FOR PLACING LOGIC FUNCTIONS AND CELLS IN A LOGIC DESIGN USING FLOOR PLANNING BY ANALOGY

[75] Inventors: Mark D. Aubel, Woodbury; Arthur F. Boehm; Joseph P. Kerzman, both of New Brighton; James E. Rezek, Mounds View; John T. Rusterholz, Roseville, all of Minn.; Richard F. Paul, South Burlington, Vt.

[73] Assignee: Unisys Corporation, Blue Bell, Pa.

[21] Appl. No.: 414,881

[22] Filed: Mar. 31, 1995

[51] Int. Cl.⁶ ................................................ G06F 17/50
[52] U.S. Cl. ...................... 364/490; 364/489; 364/491
[58] Field of Search ........................ 364/488, 490, 364/491, 489, 578

[56] References Cited

U.S. PATENT DOCUMENTS

| | | | |
|---|---|---|---|
| 4,580,228 | 4/1986 | Noto | 364/491 |
| 4,686,629 | 8/1987 | Noto et al. | 364/491 |
| 4,815,003 | 3/1989 | Putatunda et al. | 364/491 |
| 4,918,614 | 4/1990 | Modarres et al. | 364/490 |
| 5,224,056 | 6/1993 | Chene et al. | 364/490 |
| 5,237,514 | 8/1993 | Curtin | 364/490 |
| 5,249,133 | 9/1993 | Batra | 364/489 |
| 5,267,176 | 11/1993 | Antreich et al. | 364/491 |
| 5,303,161 | 4/1994 | Burns et al. | 364/490 |
| 5,311,443 | 5/1994 | Crain et al. | 364/491 |
| 5,349,536 | 9/1994 | Ashtaputre et al. | 364/491 |
| 5,363,313 | 11/1994 | Lee | 364/491 |

OTHER PUBLICATIONS

Carl Sechen, "VLSI Placement and Global Routing Using Simulated Annealing" Kluwer Academic Publishers, 1988, pp. 1–19.

R.E. Massara, Ed. "Design and Test Techniques for VLSI and WSI Circuits Peter Peregrinus", Ltd., 1989, pp. 14–27.

*Primary Examiner*—Kevin J. Teska
*Assistant Examiner*—Phallaka Kik
*Attorney, Agent, or Firm*—Charles A. Johnson; Mark T. Starr

[57] ABSTRACT

A method used by a computer-aided design system for placing logic functions and cells in a floor plan of a very large scale integrated circuit chip. The structure of a set of selected logic functions and cells to be placed is compared to a set of selected logic functions and cells which have previously been placed in the floor plan. If the number of cells and the structure of the sets are analogous, the selected logic functions and cells to be placed are automatically assigned physical positions in the floor plan based on the physical position and structure of the selected logic functions and cells that have already been placed, and on an orientation mode. The orientation mode provides for the reflection of the placement of the selected logic functions and cells about the horizontal axis, the vertical axis, or both the horizontal and vertical axes. The size of the sets of selected logic functions and cells may be arbitrarily large, thereby providing advantages over simple manual placement of logic functions and cells in a floor plan.

39 Claims, 17 Drawing Sheets

Logical Hierarchy

```
FIVE : FIVEBIT (0)
. B2 : FOURBIT (1)
. . ADD1 : FULL_ADDER (2)
. . . H_ADD1 : HALF_ADDER (3)
. . . H_ADD2 : HALF_ADDER (4)
. . ADD2 : FULL_ADDER (5)
. . . H_ADD1 : HALF_ADDER (6)
. . . H_ADD2 : HALF_ADDER (7)
. . ADD3 : FULL_ADDER (8)
. . . H_ADD1 : HALF_ADDER (9)
. . . H_ADD2 : HALF_ADDER (10)
```

FIG. 9

*Logic Design : FIVEBIT*

```
<- [CHBBC] B2C00
N2500    <- [CHBBC] B1400
<- [CHBBC] B22C00
<- [CHBBC] B23C00
<- [CHBBC] B2700
<- [CHBBC] B222C00
<- [CHBBC] BC00
<- [CHVOA] BRAMST_000
<- [CHVOA] BRAMST_100
<- [CHVOA] BRAMST_200
<- [CHVOA] BRAMST_300
<- [CHVOA] BRAMST_400
```

FIG. 10

```
Browse : FIVEBIT

FIVEBIT : FIVEBIT (T[161] P[127] U[341] : 107360.00)
• B2     : FOURBIT (T[21] P[20] U[1]   : 3520.00)
• B7     : FOURBIT (T[21] P[20] U[1]   : 3552.00)
• B31    : IO_BUFFER (T[1] P[1] U[0]   : 320.00)
• B31    : IO_BUFFER (T[1] P[1] U[0]   : 320.00)
• IT1_BUF_0 : IO_BUFFER (T[1] P[1] U[0] : 320.00)
• IT1_BUF_1 : IO_BUFFER (T[1] P[1] U[0] : 320.00)
• IT1_BUF_2 : IO_BUFFER (T[1] P[1] U[0] : 320.00)
• RANK2_0 : FULL_ADDER (T[5] P[5] U[0] : 832.00)
• RANK2_1 : FULL_ADDER (T[5] P[5] U[0] : 832.00)
• RANK2_2 : FULL_ADDER (T[5] P[5] U[0] : 832.00)
• RANK2_3 : FULL_ADDER (T[5] P[5] U[0] : 832.00)
• RANK2_4 : FULL_ADDER (T[5] P[5] U[0] : 832.00)
```

FIG. 11

```
Inspect : FIVEBIT name: FIVEBIT
units: tracks
place: 243.50 213.50
size: 8096.00 8096.00
  -- sizins --
cells: 161
cellArea: 107360.00 rArea: 65545216.00
   --format--
grid x: 0.00
grid y: 0.00
  -- Control option --
Analogy Type: Clear
out of context: yes
Group context: yes
Stack Mode: no
Frame View on Context: no
Selection expansion: 32000
Show Wires @ Placment: no
Flip In Place: yes
Show Bus wire Limit: 0
Filled Cells: no
WhiteSpace Prompt: 7
Report Def Pre-layout Overlaps: no
Report overlaps: no
Region Unplace limit: 5
```

FIG.12

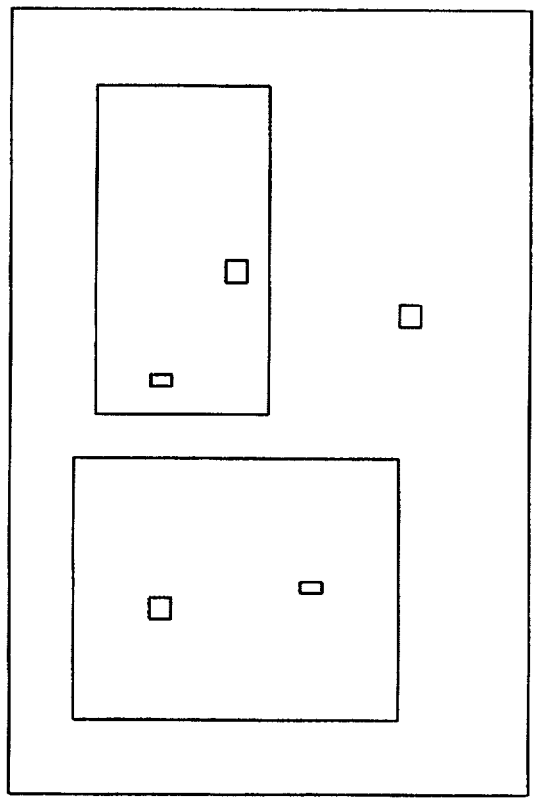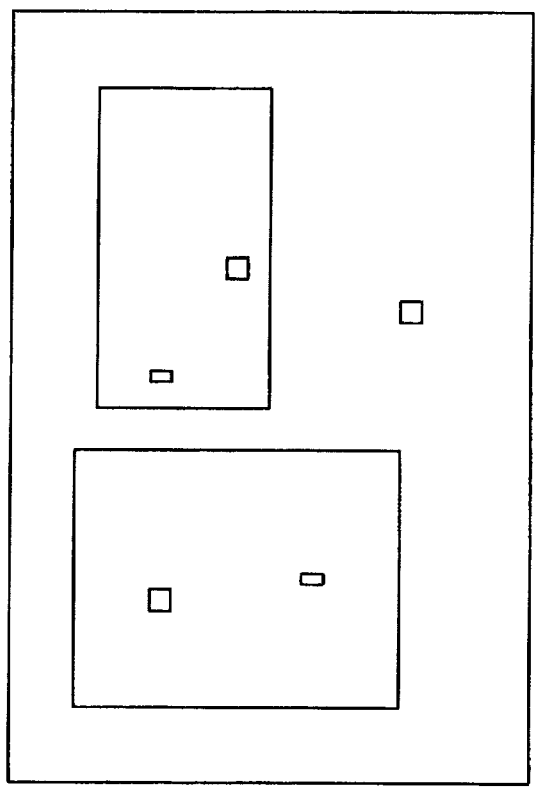
FIG. 16

METHOD FOR PLACING LOGIC FUNCTIONS AND CELLS IN A LOGIC DESIGN USING FLOOR PLANNING BY ANALOGY

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND OF THE INVENTION

1. Field of the Invention

This invention relates generally to computer-aided design (CAD) techniques for placement of logic functions and cells on an integrated circuit chip during the chip design process. The invention is more specifically related to a method, typically embodied in a CAD system, for placing logic functions and cells on an application specific integrated circuit (ASIC) chip.

2. Background Information

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer and output devices, such as computer displays, being used to provide visual feedback of the design to the designer as it is being constructed. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

The hierarchy of a logic design consists of "N" levels of functions, where N is an integer (N>=1) representing the number of hierarchical levels of functionality in the chip, the first level being the chip itself, and where "n" is an integer (1<=n<=N) representing the level of any particular function in the hierarchy. A function consists of a discrete logic and/or memory element, or any combination of such elements. It may be as simple as an inverter or a flip-flop, consisting of one or only a few transistors, or as complex as a shift register, an arithmetic logic unit (ALU), or even a microprocessor. A parent function at the (n)th level of the hierarchy is defined as a plurality of (n+1)st level functions, each of which is a child function. For example, a microprocessor at the (n)th level might be defined as the parent of the following (n+1)st level children: an ALU, a series of registers, a bus, and various other functions (each of which may or may not have a plurality of (n+2)d level children, and so on). Each child function which is not also a parent function (i.e., which has no children) is referred to as a leaf function or cell.

The concept of the hierarchy of containment described above is orthogonal to the concept of logic interconnection nets. Each leaf cell in a design is connected to at least one other leaf cell, such connection being commonly referred to as a "net." The set of nets, each of which defines a plurality of interconnected functions, is commonly referred to as a "netlist."

Two common methods for specifying the design are schematic capture and hardware description languages. The schematic capture method provides a sophisticated user interface which allows a logic circuit to be drawn in graphical form on a computer display. The design is often specified with standard logic symbols such as NAND gates and NOR gates. Using this method, the circuit is defined in small building blocks.

Typically, it is useful to distinguish between those cells provided by the chip vendor as primitive cells (i.e., leaf candidates) and the user-defined hierarchy blocks built upon them. One way is to speak of a cell library" vs. a "design library" as two separate libraries, both of which are available to subsequent designs. Alternatively, at least initially, a design library contains a standard cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a particular 2NAND component is specified as part of a given circuit design, it is given an instance name, to distinguish it from all other 2NAND gates used in the circuit. The instance name typically includes the instance names of all parent instances by concatenation when defining the instance in the context of the chip. A single name is sufficient when dealing only in the context of a single user function. The user-defined blocks can then be used to design larger blocks of greater complexity. The user-defined blocks are added to the design library, which grows from the additions of new design modules as the design evolves. The top level of the design hierarchy will be a single block that defines the entire design, and the bottom layer of the hierarchy will consist of leaf cells, the cells (i.e., the logical components) that were originally provided in the cell library. Note that the hierarchy is typically structured as a special kind of a graph called a tree.

Encoding the design in a hardware description language (HDL) is the other major design entry technique used to specify modern integrated circuits. Hardware description languages are specially developed to aid a designer in describing a circuit. These languages often contain specific functions and syntax to allow complex hardware structures to be described in a compact and efficient way. The HDL program specifying the design may be compiled into the same data format produced by schematic capture, thereby providing a designer great flexibility in methods used for specifying a logic design. The design concepts of libraries, cells, hierarchies, interconnects, etc., discussed above in regard to design by schematic capture are equally applicable to designs specified by a HDL.

The output of the design tools is a logic design database which completely specifies the logical and functional relationships among the components of the design. Once the design has been converted into this form, it is necessary to verify that the logic definition is correct and that the circuit implements the function expected by the designer. This verification is currently achieved by simulation. The design undergoes design verification analysis in order to detect flaws in the design. The design is also analyzed by simulating the device resulting from the design to assess the functionality of the design. If errors are found or the resulting functionality is unacceptable, the designer modifies the design as needed. These design iterations help to ensure that the design satisfies its requirements.

The logic design database is then passed as input to a placement tool. Placement is the process whereby each logic function or cell of the design is allocated to a physical position or location on the silicon chip. The purpose of placement is to allocate the positions of cells in such a way that they can be successfully connected together by routing software. A group of components which perform a given function (i.e., a block) and blocks which are closely related electrically should be physically placed as close as possible to one another. Physical proximity conserves space on the chip, simplifies routing of the interconnecting nets, and maximizes or enhances performance. Excess capacitances and resistances caused by long interconnect paths between cells will slow down the circuit and, in certain cases, delay critical signals and possibly cause functional failures. The placement effort also aims to allocate the cells so that the total interconnect between cells is minimized and undue routing congestion is avoided. Placement may take place either manually or automatically, or in combination. If placement is done manually, a chip designer interacts with a placement tool to define the location on the chip where each logic function or cell is to be placed. Automatic placement relies on sophisticated algorithms to place the logic function cells on the chip according to a set of heuristics, without the need for human intervention. Placement tools rely on the cell library in making their placement decisions.

Generally, the goal of the placement process is to generate a placement solution that will be as easy to route as possible given the time allowed for solution generation. As with many other areas of computer-aided design, there is a trade-off between the closeness of the final solution to a theoretical optimal solution and the time required to compute such a solution (when using automatic placement) or the time needed by a human designer to figure out an acceptable approximation to such a solution (when using manual placement). Times taken for placement may be measured in minutes, many hours, or many months of effort, depending on how good a solution is desired and the complexity of the circuit. Initial improvements to a random placement can produce significant improvements, but later modifications are likely to have reduced effects. The last small amounts of improvement that can be theoretically possible may be difficult to achieve within a reasonable timescale or consumption of computing resources. However, in reality, the initial placement is never a random placement. Modifications to the initial placement depend more on the mount of freedom allowed in the modifications of cells than the time to make the initial modification itself. As circuits get more complex and recent packaging technology advances allow for sub-micron device geometries, it is rapidly becoming extremely difficult for a human chip designer to manage the complexity of the placement and routing operations. Human chip designers usually produce better placements than automatic tools, but when the number of cells in the design approaches 100,000 cells, the time needed for complete manual placement may become prohibitive.

Many integrated circuit architectures are designed so that component patterns exhibit a line of symmetry allowing reflection operations by the placement tool, which improves placement by minimizing the unnecessary crossing over of connections between cells. The cell library will usually be designed to assist the placement tool in this regard, for example, by including cells that are designed to have a large number of equivalent connection points, making connection to them easier.

After placement is complete, the routing step must be performed. As mentioned above, a net is a set of points that are to be electrically equivalent by connection; any connection between a subset of these points is referred to as a subnet. The purpose of routing is to connect points in each net of the logic design so that the connections required within nets are complete. The position of the points in any particular net are decided by the placement process, although there may be sets of points that are already connected together, thereby introducing choices as to where a connection has to be made to complete a net. Global routing aims to decide exactly which points in each net will be connected together and the approximate path that each connection will take. Fine routing involves determining the final paths of all connections needed to complete the design. Automatic routing by routing tools often requires a large amount of computational effort. The routing problem can be significantly reduced in complexity if a near-optimal placement of the cells has been achieved. It is during this final stage of the physical design of the circuit that the inability to complete the design on a particular sized chip and architecture is detected. This layout failure may have been caused by an unsatisfactory placement. Often, the failure to complete the design is only apparent when the final few percent of the connections are being added. Hence, it is critical that an excellent placement of the cells is generated during the placement process.

During post-layout verification, the operation of the logic design is examined. The post-layout tools extract the lengths of the connection paths between logic blocks and inserts appropriate resistances and capacitances into the circuit model to give a more accurate description of the actual circuit in the time domain. The post-layout verification of the design validates time-critical areas and detects glitches and other timing errors. After post-layout verification, masks and test patterns are automatically generated for use in manufacturing mad testing the circuit.

Large integrated circuit designs are defined in terms of a number of interconnected functional blocks. The purpose of the placement process is to find a position for each block so that certain criteria are satisfied. The most obvious criteria is to provide a placement that will allow all of the defined connections within the design to be routed between the blocks. However, this is very difficult to evaluate and therefore other criteria are often used. Placement may be optimized according to one or more criteria, including total interconnection between blocks, total length of a subset of significant or critical connections, or areas of predicted routing congestion. The criteria for defining the "goodness" of the placement solution has two major components. The first component is the resulting routing complexity. The second component is a measure of the timing characteristics. Good placements often sacrifice routing complexity on non-time critical nets to ensure short routing for those nets which are critical.

The range of different placement solutions will depend on the fabrication technique by which the design is to be implemented. There are two styles of Application Specific Integrated Circuits (ASICs): custom and cell-based. The cell-based methodology is further divided into gate arrays, where the diffusion portions of the chip are fixed, and semi-custom, where the cell placement determines the diffusion set. In any case, there is no guarantee that a complete routing solution can be found. Current chip design methodologies do not inherently reserve space routing, instead the routing is done over the cells. When routing congestion appears, the placement is then adjusted to reduce the utilization of cells in the congested area to allow a reduction in routing density. Each gate array will have a limited number of active components that can be used and designs requiring additional components will not fit on the chip. In practice, it is usually the lack of space available on the gate array for interconnections between the blocks that makes a placement solution impossible. Indeed, in some cases, the area required for routing the connections is greater than the area used for the logic functions. With a full-custom design, if there are no limits to the size of the final device and if at least two layers are allowed for interconnection, it will always be possible to create a placement that can be successfully routed. The main function of placement, in these cases, is to produce a solution that will not waste silicon area and thereby increase the fabrication cost of the design.

The placement solution obtained directly affects the complexity of the routing problem that must be successfully completed to produce a complete and valid physical design. Careful placement of logic functions can reduce the floor space of a circuit on a chip by as much as 30–40% by minimizing the routing density. This improvement has a direct correspondence to the final cost of the chip. A range of different algorithms exist to identify a locally optimum solution to the placement problem within relatively short amounts of processing time, including initial placement and successive improvement strategies. Finding a globally optimum solution is, however, a very complex problem. This results in all placement strategies having an implied trade-off between the quality of solution obtained and the processing time required to obtain it.

Clearly, any improvement in placement techniques that significantly reduces the time required to produce a placement solution would be very beneficial. As the size of integrated circuit devices shrink and the number of logic functions increases (currently in the 100,000 cells per chip range), the planning of the interconnections between logic functions becomes the dominant portion of the time associated with designing the circuit. This requires the chip designer to become more involved in the organization of the chip. Manual specification of the organization of a large number of the logic functions has a negative impact on the development schedule of the chip. If the placement solution can be generated more rapidly, design cycle times can be reduced, thereby allowing a developer to bring products to market faster than before.

Manual placement tools may be used to provide directives to automatic placement and routing tools. These directives instruct the automatic placement tool to place a logic function or cell at a specified location or to place that cell within a given portion of the chip. The large number of cells in contemporary integrated circuit chips makes the management of specifying these directives very complex. While computer graphics can be used to provide visual feedback to the chip designer of the placement of the cells and the areas that have been defined, limited methods exist to compactly show the effect of cells that have not been associated with an area not placed. When using existing tools, the designer is required to individually specify the placement of each of the cells, after which the graphical representation is then displayed. The effects of the routing are then evaluated by displaying the interconnections between the sets of cells.

Optimization of the placement/routing solution and reducing the time needed to obtain the solution are important goals of chip designers. When multiple passes are made through the design layout process, designer-controlled manual placement of logic functions and cells makes the routing results, and therefore the timing/performance results, more predictable and reliable than existing automatic placement methods. Because of this, and also the recent increases in chip density and number of logic functions per chip, improvements to existing manual placement techniques and tools are needed.

SUMMARY OF THE INVENTION

An object of this invention is to decrease the time required for the manual placement of logic functions and cells on an integrated circuit chip.

Another object of this invention is to support the reduction of floor space on a chip required for implementing a given integrated circuit design.

Yet another object of this invention is to minimize the area of the chip devoted to routing the interconnections in a given integrated circuit design.

Still another object of this invention is to allow a chip designer to efficiently place recurring analogous logic function blocks in an integrated circuit design.

A further object of this invention is to provide computer-aided design tools to allow chip designers to minimize the time needed to manually place logic function blocks in an integrated circuit design.

Another object of this invention is to reduce the time and expense associated with the design process of an application specific integrated circuit (ASIC).

Yet another object of this invention is to provide tools to a chip designer to minimize the routing length between logic functions and cells.

A further object of this invention is to provide for the manual placement of a higher percentage of logic functions and cells at specific locations on an ASIC in order to minimize the interconnections between cells.

A still further object of this invention is to allow the sharing of manual placement tasks on the same or multiple ASICs between multiple chip designers.

Another object of this invention is to improve the predictability and increase the visibility of the incremental changes from one placement iteration to the next placement iteration.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the Drawings and Description of the Preferred Embodiment, with the scope and aspects of the invention defined in the appended Claims.

According to the present invention, the foregoing and other objects and advantages are attained by a novel method for placing logic functions and cells in a floor plan. The method is used in a system for designing an integrated circuit chip. The integrated circuit chip is defined in terms of logic functions composed of cells. The logic functions and cells are specified in a logic design hierarchy structured as a graph and stored in a logic function design database. The logic functions are represented in the graph as non-leaf nodes (i.e., structurally they have child nodes). The cells are represented as leaf nodes in the graph. Selected portions of the graph may comprise sub-graphs, wherein each sub-graph has a root node representing a logic function. The purpose of the system is to assign physical positions in a floor plan of an integrated circuit chip to the logic functions and cells. The system also includes an automatic placement system which accepts placement directives. Placement directives are commands to the automatic placement system to automatically place the referenced logic functions and cells in the floor plan within a specified area called a placement region.

The method comprises the steps of setting an orientation mode indicating the orientation of physical placement of a logic function or cell. The orientation mode includes selecting the reflection of the physical placement of a logic function or cell about the horizontal axis, about the vertical axis, or about both the horizontal and vertical axes. A first set of nodes (the "source" set) from the logic design hierarchy is selected. The first set of nodes is usually already placed in the floor plan or previously stored in a logic function design database. However, it is not required that all nodes of the first set be already placed. In most cases, a large percentage of the nodes in the first set will have been placed, but the percentage of placed nodes in the first set does not have to be 100%. The present method is perfectly valid for any percentage down to and including 0%. A second set of nodes from the logic design hierarchy is then selected for placement in the floor plan. The first set of nodes is compared to the second set of nodes (the "target" set) to determine if the sets are sufficiently analogous. In the preferred embodiment, if the number of nodes in each set is the same, and the parent-child relationships of each set are the same, then further processing may continue. If not, different sets of nodes must be selected. If the sets are analogous, then the second set of nodes is automatically placed in the floor plan in a manner analogous to the first set of nodes. Each node in the target set is placed so that its resulting location relative to other nodes in the target set is analogous to the corresponding source node's position relative to the other source nodes. If a source node is constrained to a region instead of being absolutely placed, the corresponding target node will likewise be constrained to a corresponding region. If a particular source leaf node is not explicitly placed, the corresponding target node will remain unplaced.

Still other objects and advantages of the present invention will become readily apparent to those skilled in the art from the following detailed description, wherein is shown and described only the preferred embodiment of the invention, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended Claims.

BRIEF DESCRIPTION OF THE DRAWINGS

FIG. 9 is a display of an example of a portion of a logic design hierarchy using the Floor Planner software.

FIG. 10 is a display of leaf cells within a given selected logic hierarchical level shown in FIG. 9.

FIG. 11 is a display of a list of placed logic functions.

FIG. 12 is a display of information relating to a placed logic function.

FIG. 16 is a display of a small section of the physical floor plan shown in FIG. 15.

DESCRIPTION OF THE PREFERRED EMBODIMENT

Figure 1:
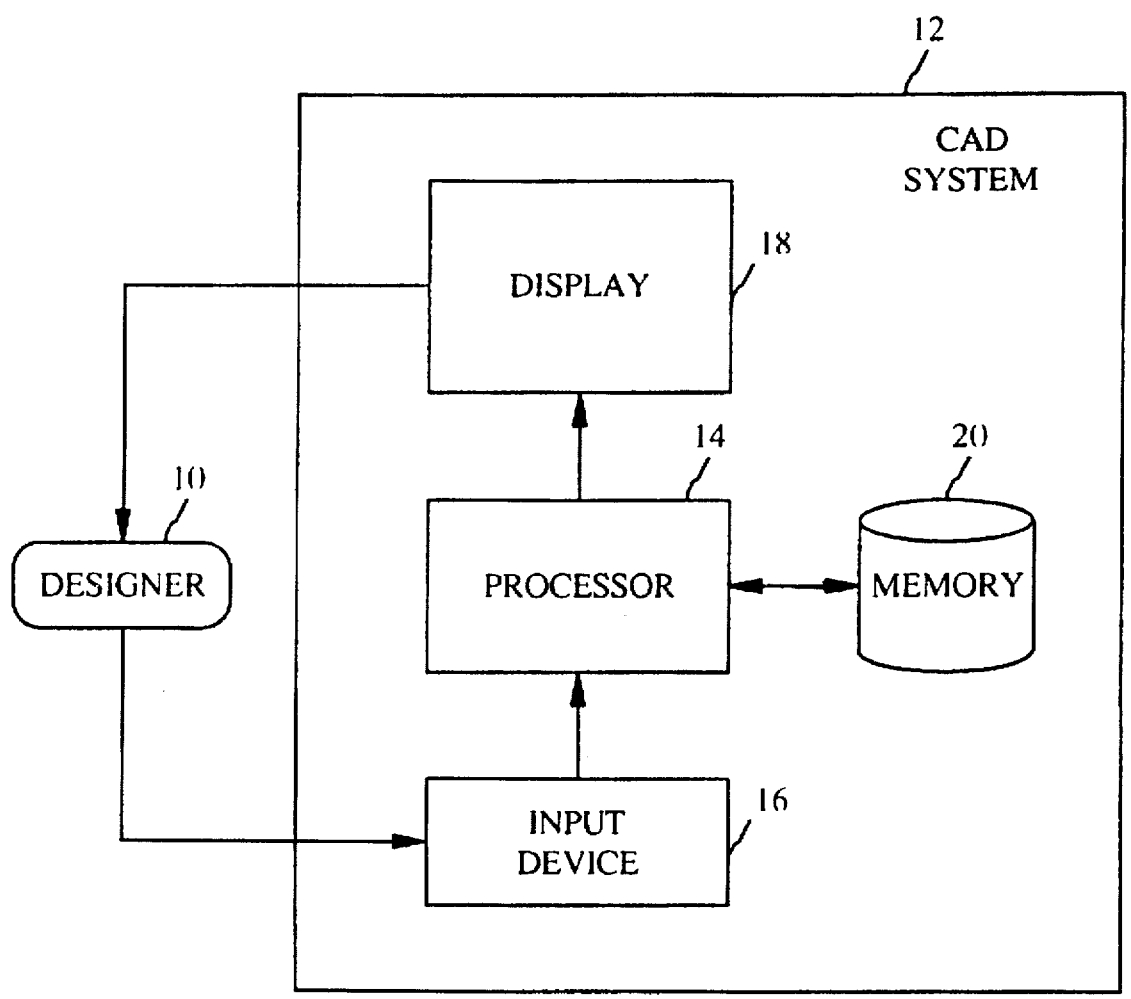
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. Enclosed herein is an illustrative example of an embodiment of the present invention written in the C++ programming language. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

General System Configuration

FIG. 1 is a block diagram of the computer-based environment of the present invention. A Designer 10 interacts with a CAD System 12 to enter a circuit design, validate the design, place the design's components on a chip, and route the interconnections among the components. The CAD System 12 includes a Processor 14, which executes operating system software as well as application programs known as CAD software. The Processor is found in all general purpose computers and almost all special purpose computers. The CAD System 12 is intended to be representative of a category of data processors suitable for supporting CAD operations. In the preferred embodiment, the CAD System is a HP A1097C Series 700 engineering workstation, commercially available from Hewlett-Packard Corporation, although other engineering workstations or computer systems from manufacturers such as Sun Microsystems, Inc., may also be used. The Designer 10 enters design information into the CAD System by using a well-known Input Device 16 such as a mouse, a keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the CAD System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The CAD software being executed by the Processor 14 stores information relating to the logic design in Memory 20. The Memory may take the form of a semiconductor memory, magnetic disks, optical disks, magnetic tape or other mass storage device.

Processing Environment

Figure 2:
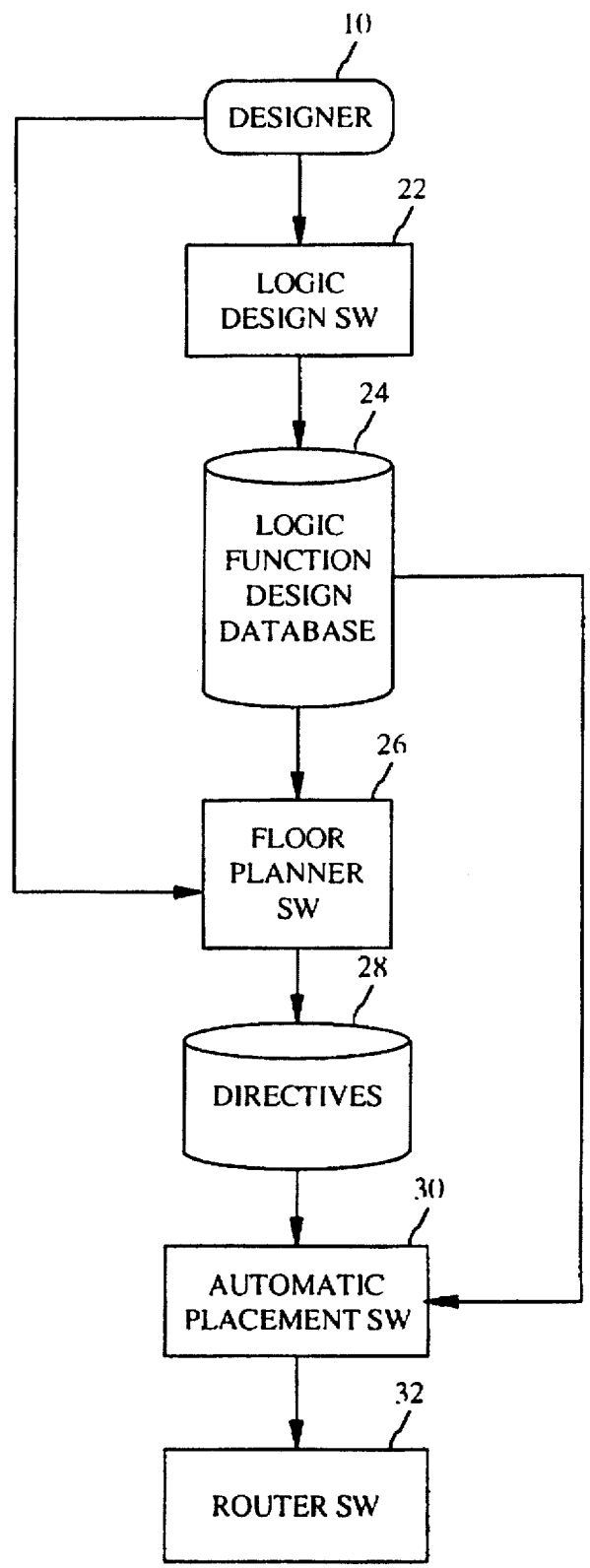
FIG. 2 is a block diagram of the process environment of the present invention.

FIG. 2 is a block diagram of the process environment of the present invention. The Designer 10 initially specifies a logic design of an integrated circuit using the graphical user interface (GUI) capabilities of the Logic Design Software (SW) 22 (i.e., when using the schematic method) or inputs a data file containing Hardware Description Language (HDL) text to the Logic Design SW (when using the HDL method). The output of the Logic Design SW 22 is a Logic Function Design Database 24. This database holds the design information, captured by the Logic Design SW 22, describing the logic functions of the circuit being designed by the Designer 10. This database is stored in the Memory 20 of the CAD System 12. The Logic Function Design Database 24 is input to the Floor Planner SW 26. The Floor Planner SW 26 is a manual placement computer program used to place the logic function blocks and cells onto the integrated circuit chip. The Designer 10 interacts with the Floor Planner SW 26 to direct the placement of the logic blocks and cells. The output of the Floor Planner SW 26 is a set of Directives 28. Directives consist of commands and associated information to direct the Automatic Placement SW 30 to complete the placement of all logic functions and cells that are yet to be placed after the Designer has finished manually placing logic functions and cells. Directives 28 are also stored in the Memory 20 of the CAD System 12. Automatic Placement SW also takes the Logic Function Design Database as an input parameter. The Automatic Placement SW 30 then forwards the completed placement to the Router SW 32 for determination of the routing for the chip.

In the preferred embodiment, the present invention exists as improvements to Floor Planning SW 26 to provide the Designer 10 with the capability to easily replicate the placement of similar blocks of logic contained in the design. The invention is a method for creating Directives to the Automatic Placement SW 30. Very often a logic design hierarchy contains multiple occurrences of logic functions. Typically, the Designer works out a suitable placement for the nodes of one such instance. Then, using the present invention, that relative placement is imparted to the other instances analogously, each at its own base location.

Figure 3:
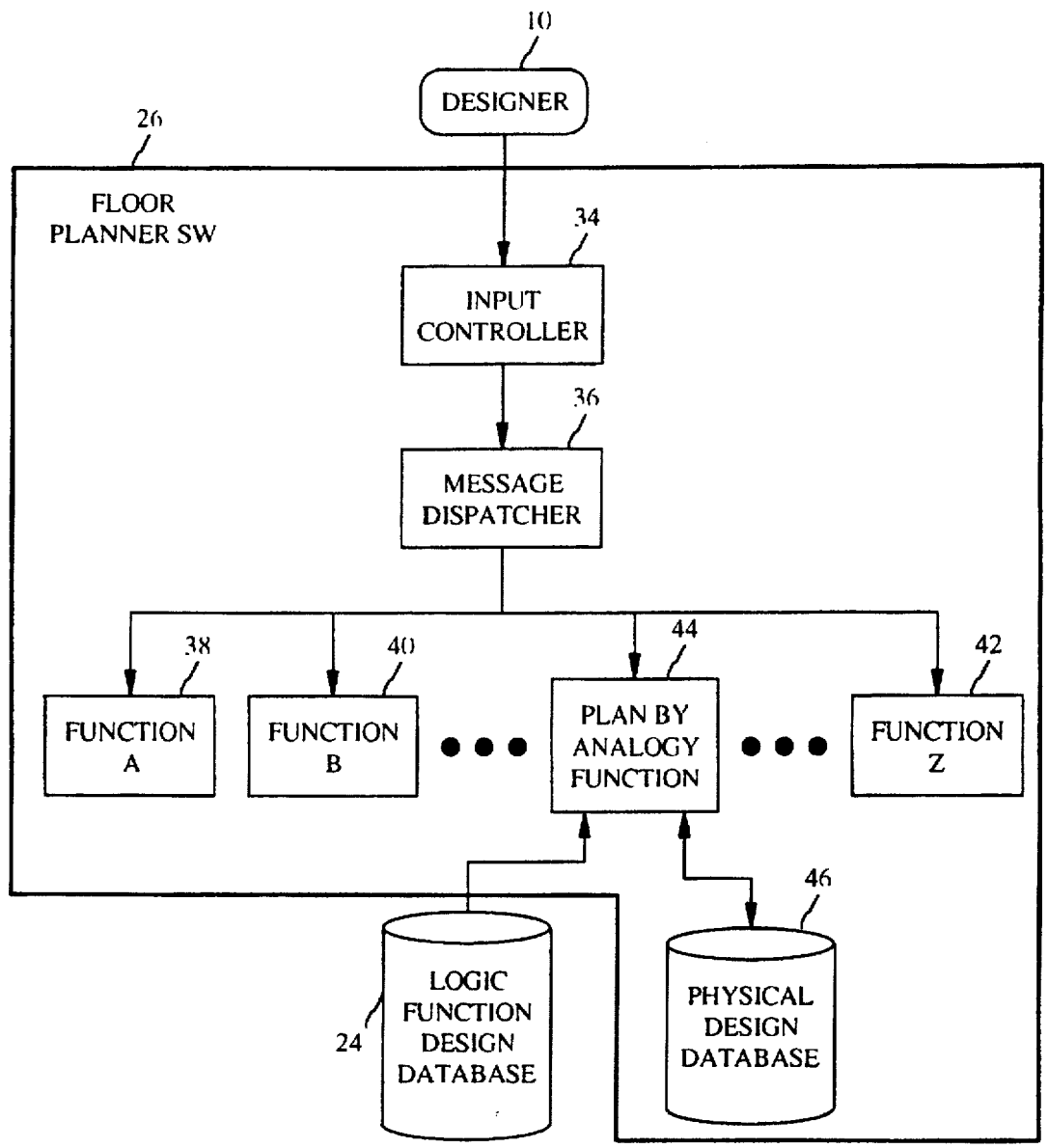
FIG. 3 is a block diagram of the Floor Planner software containing the preferred embodiment of the present invention.

FIG. 3 is a block diagram of the Floor Planner software containing the preferred embodiment of the present invention. The Designer 10 interacts with the Floor Planner SW 26 to place logic functions specified in the Logic Function Design Database 24 onto an ASIC chip. The Designer uses an input device such as a mouse to make selections from menus containing requests for particular functions to be executed. The Designer also selects portions of the logic function hierarchy to be placed and locations on the ASIC chip where the selected logic functions are to be placed. The Input Controller 34 handles all input requests from the Designer. Input requests are translated into messages requesting the execution of functions supported by the Floor Planner SW. These messages are forwarded by the Message Dispatcher 36 to various Floor Planner SW functions as required. Sample Floor Planner SW functions are represented on FIG. 3 as Function A 38, Function B 40, and Function Z 42. When a function receives a message, it is activated to implement the request contained in the message. This implementation usually involves an update to the representation of placement processing shown on the Display 18 (not shown of FIG. 3). One of the many functions supported by the Floor Planner SW is the Plan By Analogy function 44. The Plan By Analogy function allows the Designer to quickly place a target portion of the logic function hierarchy that is analogous to a source portion of the logic function hierarchy. The source portion may be contained within some other branch of the logic function hierarchy being planned or may be an independently defined hierarchy. The processing steps of the present invention are embodied in the Plan By Analogy function. The Plan By Analogy function 44 reads and writes the Physical Design Database 46 during Plan By Analogy processing. The Physical Design Database 46 is a data structure holding all placed and unplaced logic functions that are specified by the Logic Function Design Database 24.

Process Description

Figure 4A:
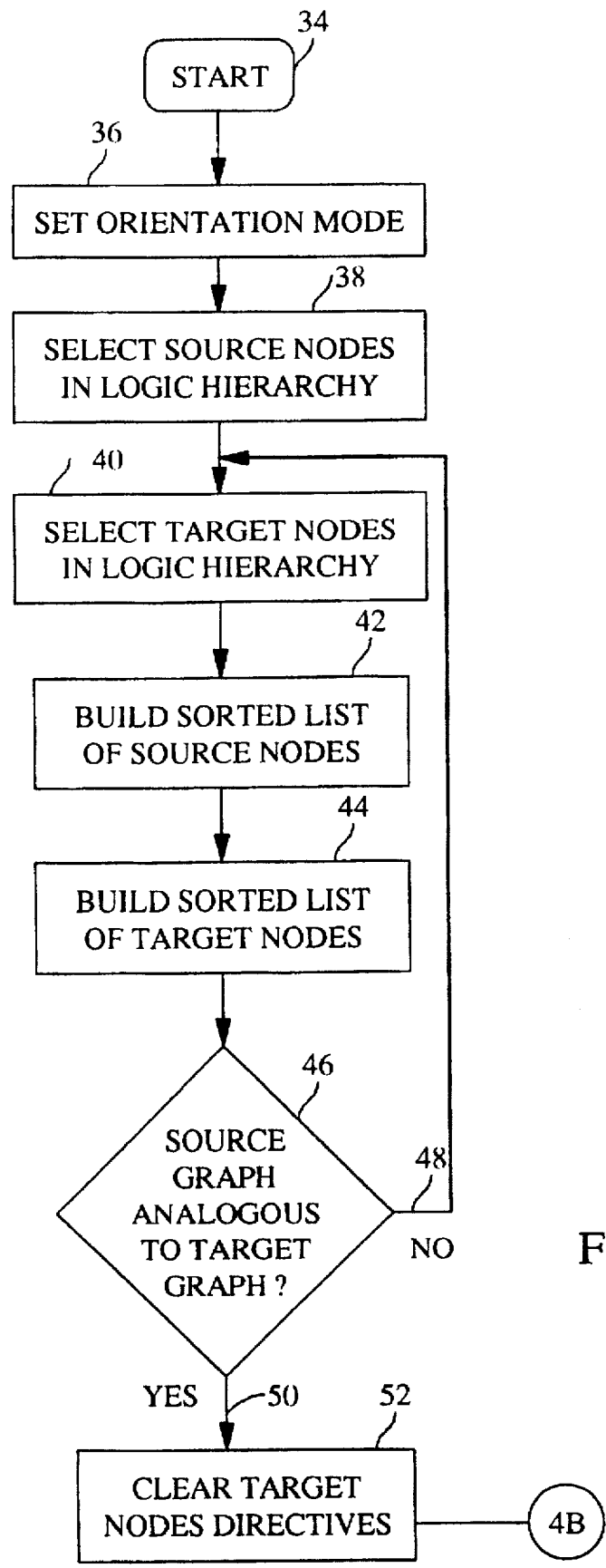
FIG. 4A and FIG. 4B are flow charts illustrating the steps of the present invention.
Figure 4B:
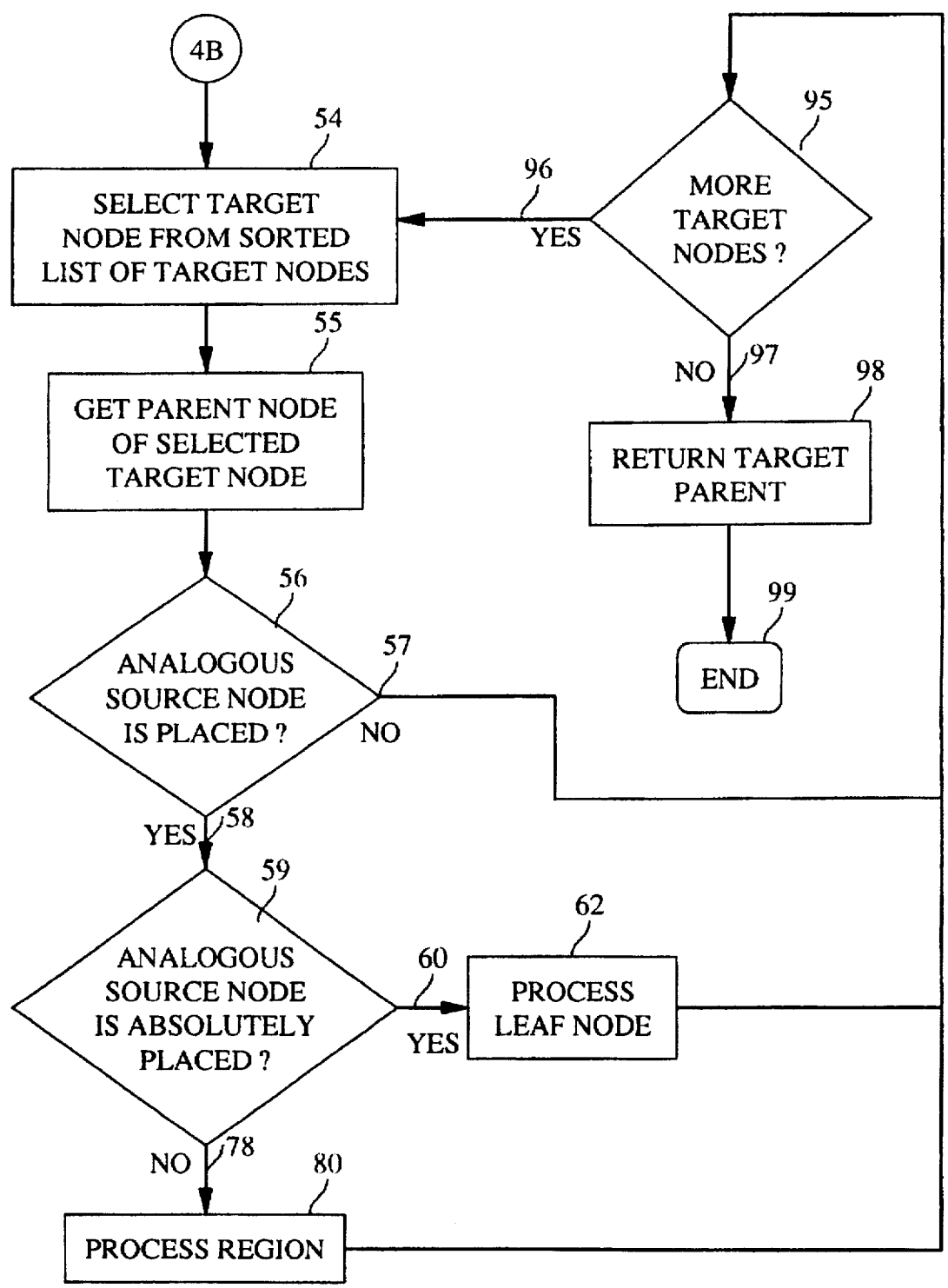

FIG. 4A and FIG. 4B are flow charts illustrating the steps of the present invention. After Start step 34, the Designer 10 at Step 36 sets the orientation mode to be used for subsequent uses of the Plan By Analogy function. The orientation mode indicates the physical placement orientation of the target logic functions and cells compared to the source logic functions and cells. Possible orientation modes include reflection about the horizontal axis, reflection about the vertical axis, reflection about both the horizontal and vertical axes, and no reflection. Next, at Step 38, the Designer selects one or more source nodes from the logic design hierarchy. Recall that the logic hierarchy is stored as a graph in the Logic Function Design Database 24. A node in the graph represents a logic function if it has child nodes, or a cell if it does not have child nodes. The source selection step involves saving a pointer to the data object in the logic hierarchy holding the parent of the selected nodes. A selection of a node that is a parent (i.e., non-leaf node) also implies a selection of all child nodes. This set of source nodes, parent and all children, is used as the source template during subsequent planning by analogy. The source template is also called a source graph. It should be understood that the source graph can be another branch of the current chip logic hierarchy or may be part of a logic hierarchy of an independent chip. In the later case, a separate graph is constructed. At Step 40, the Designer selects the target set of nodes to be placed based on the structure of the source set of nodes. A pointer to the target nodes in the Logic Function Design Database is saved. The source graph therefore represents the logic design hierarchy of that portion of the entire design which has been selected by the Designer. It is intended to act as a template for subsequent placement of other, i.e., target, portions of the logic design. The complete graph for the logic design hierarchy arises from the natural structuring that occurs during the logic design process. The source and target graphs may actually be any sub-graphs of the graph representing the complete logic design hierarchy.

Although not shown in FIG. 4A, the Designer could repeat selection steps 36 and 38 for each set of nodes to be planned by analogy. The selection of a target graph at Step 40 triggers the initiation of the Plan By Analogy function. At Step 42, a sorted list of selected source nodes is built. This list, which also could be implemented as a table, array, or other suitable data structure, is sorted by parent pointer, and by name within each parent sub-graph. Each list entry contains a pointer to an object in the source graph. A similar sorted list is built for selected target nodes at Step 44. It must be determined if the source and target sets of nodes are suitable for planning by analogy. The two graphs are compared at Test Step 46. Ideally, there should now be a one-to-one correspondence between each entry in the source list and an entry in the target list. If the graphs are not sufficiently related (that is, the source graph is not analogous to the target graph), then the Designer is shown an error message on the Display and prompted to select new source and target sets of node. Processing in this case follows No path 48 back to Step 40 for a new selection of target nodes.

In the preferred embodiment of the present invention, the comparison step checks that the source graph and the target graph have the same number of nodes and the same parent/child relationships. If any of these conditions does not match, then it is indicated that planning by analogy would fail. However, in alternate embodiments more elaborate comparisons could be made to the graphs, such as checking sub-sub-graphs, and the like.

If the source and target graphs are analogous, then Yes path 50 is taken to Step 52, where any directives to the Automatic Placement SW 30 that may have previously been associated with the target set of nodes are cleared from the Directives database 28. This insures that conflicting directives are not given to the Automatic Placement SW 30 or the Router SW 32. In the preferred embodiment, the data structure holding the directive information for the target nodes is reinitialized. This action also results in the removal from the Display of the selected target nodes. The directive information includes the X,Y placement points and orientation on the chip of the logic function or cell represented by each node. The integrated circuit chip is referenced according to a Cartesian coordinate system whereby the origin (0,0) is situated at the lower left corner of the chip. In the preferred embodiment, the placement units of this system are selected by the user.

Processing continues on FIG. 4B via connector 4B. The source and target graphs are traversed beginning with Step 54. A Breadth First Search (BFS) is used to traverse the graphs in the preferred embodiment, although a Depth First Search (DFS) could also be used. There are two types of placement for a leaf node, absolute and region-based. During absolute placement, a leaf node is given an explicit (x,y) location in the floor plan. During region-based placement, a leaf node is constrained to a rectangular region of the floor plan defined by two corners (x1,y1)(x2,y2). Non-leaf nodes may be assigned a region or may be unplaced. At Step 54, a target node from the sorted list of target nodes is selected. The selected target node will be matched, to a corresponding source node in the sorted source node list. At Step 55, the pointer to the parent node of the selected target node is obtained. If the analogous source node has not yet been placed in the floor plan at Test Step 56, then No path 57 is taken and no further processing of the selected target node is undertaken. If the analogous source node has been placed in the floor plan, then Yes path 58 is taken to Test Step 59. If the analogous source node is an absolutely placed node at Test Step 59, then Yes path 60 is taken to Step 62. Processing of an absolutely placed leaf node is then undertaken. Recall that a leaf node represents a cell and not a higher level defined function.

Figure 5:
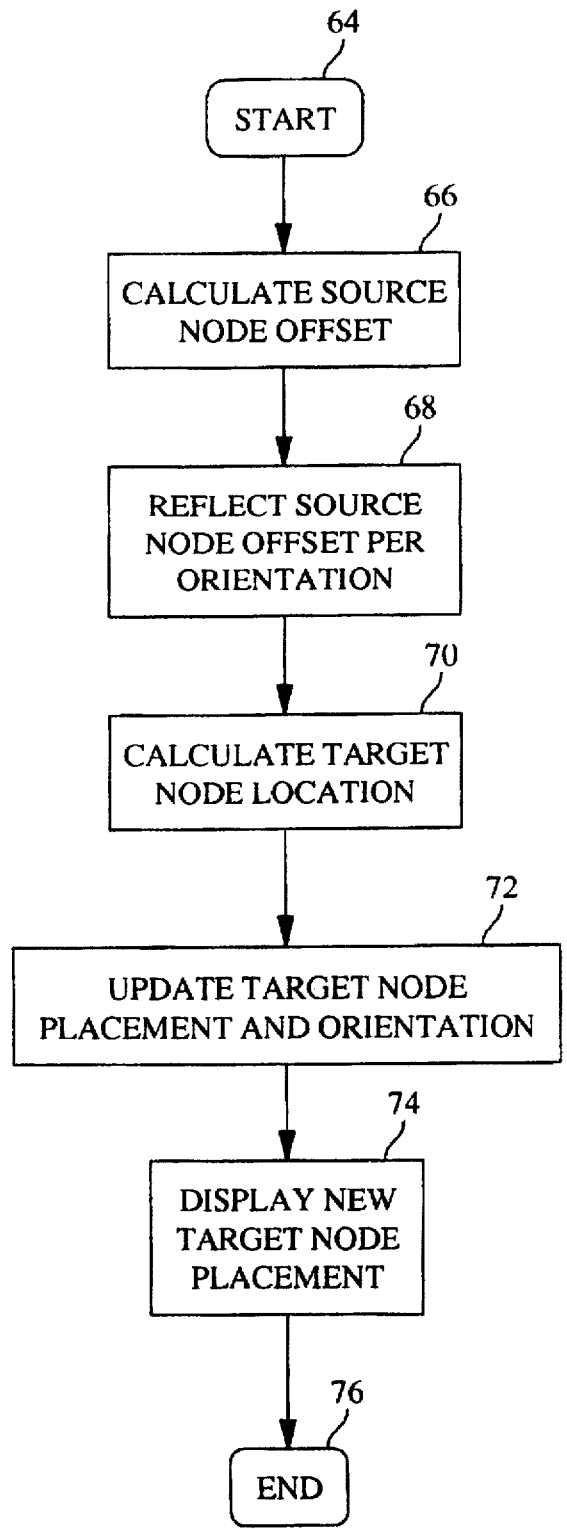
FIG. 5 is a flow chart illustrating the steps for processing an absolutely placed cell.

FIG. 5 is a flow chart illustrating the steps for processing an absolutely placed cell. After Start Step 64, the offset (within the Cartesian coordinate system of the chip) of the analogous source node is calculated. This offset is relative to the base X,Y position of the root node of the sub-graph used as a source graph. Next, at Step 68, the source node offset is reflected per the orientation selected by the Designer. At Step 70, the location of the target node is calculated based on the source node offset and the selected orientation, and the base X,Y position of the root node of the sub-graph used as a target graph. The target node placement (that is, the X,Y coordinates) and orientation are assigned to the target node data object at Step 72. The Display 18 is then updated by showing the new target node placement at Step 74. In the preferred embodiment, this action is implemented by an appropriate call to graphical user interface software. Processing of a target cell ends at End Step 76.

Referring back to FIG. 4B, if the selected source node is not absolutely placed (i.e., it is a region-placed node, which may be either a leaf node or a non-led node), then No path 78 is taken to Step 80, where processing of a region takes place. A region is an area within the chip where a group of target cells is to be placed. However, the final placement of the cells is done by the Automatic Placement SW 30, not the Planning By Analogy software. Placing target cells in a region allocates the cells to a bounded area of the chip, without specifying exactly where in that area each of the cells is to be placed. When the actual Directives 28 are created, each cell follows its ancestor node pointers up the logic design hierarchy until it finds a placed region and uses that directive.

Figure 6:
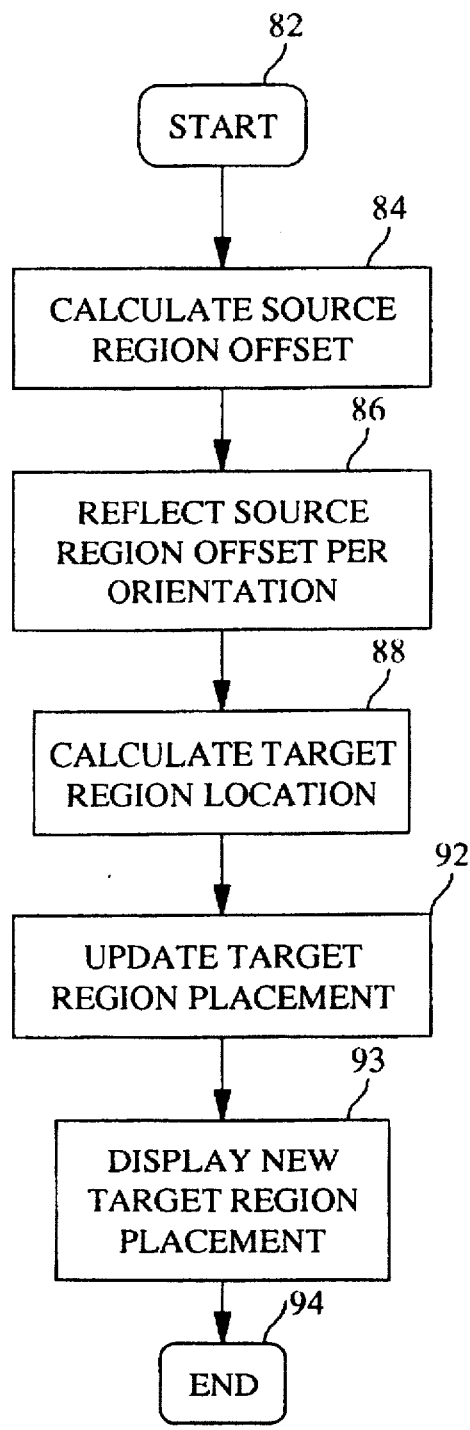
FIG. 6 is a flow chart illustrating the steps for processing a region.

FIG. 6 is a flow chart illustrating the steps for processing a region. After Start Step 82, the offset (within the Cartesian coordinate system of the chip) of the analogous source region is calculated at Step 84. This offset is relative to the base X,Y position of the root node of the sub-graph used as a source graph. Next, at Step 86, the source region offset is reflected per the orientation selected by the Designer. At Step 88, the location of the target region is calculated based on the source region offset and the selected orientation, and the base X,Y position of the root node of the sub-graph used as a target graph. The target region placement (that is, the X,Y coordinates) is assigned to a target region data object at Step 92. This data includes two sets of X,Y pairs for the sub-graph, but not any orientation information, because orientation is an attribute of a cell and not an area. The Display is updated by showing the new target region placement at Step 93. In the preferred embodiment, this action is implemented by an appropriate call to graphical user interface software. Processing of a target region ends at End Step 94.

Referring back to FIG. 4B, processing continues at Step 95. If there are more target nodes to process, then Yes path 96 is taken back to Step 54. If there are no more target nodes selected that have not been processed, then No path 97 is taken to Step 98. At this step, the updated data structure for the target parent object is returned to the Message Dispatcher 36 thereby allowing other floor planning functions to be performed on the results of the Plan By Analogy. Processing ends at End Step 99.

It should be noted that the selection of a source graph and a target graph is not limited to a single Logic Function Design Database. The present invention supports the selection of source and target graphs from different design databases. In fact, the ability of chip designers to reference different Logic Function Design Databases, each containing one or more distinct ASIC designs, when using floor planning by analogy is one of the most important advantages of the present invention. It allows multiple chip designers, each working independently on one or more ASIC designs, to use previously defined portions of other designer's ASIC designs to quickly place analogous logic functions in their own ASIC designs.

Example of Plan By Analogy

Figure 7:
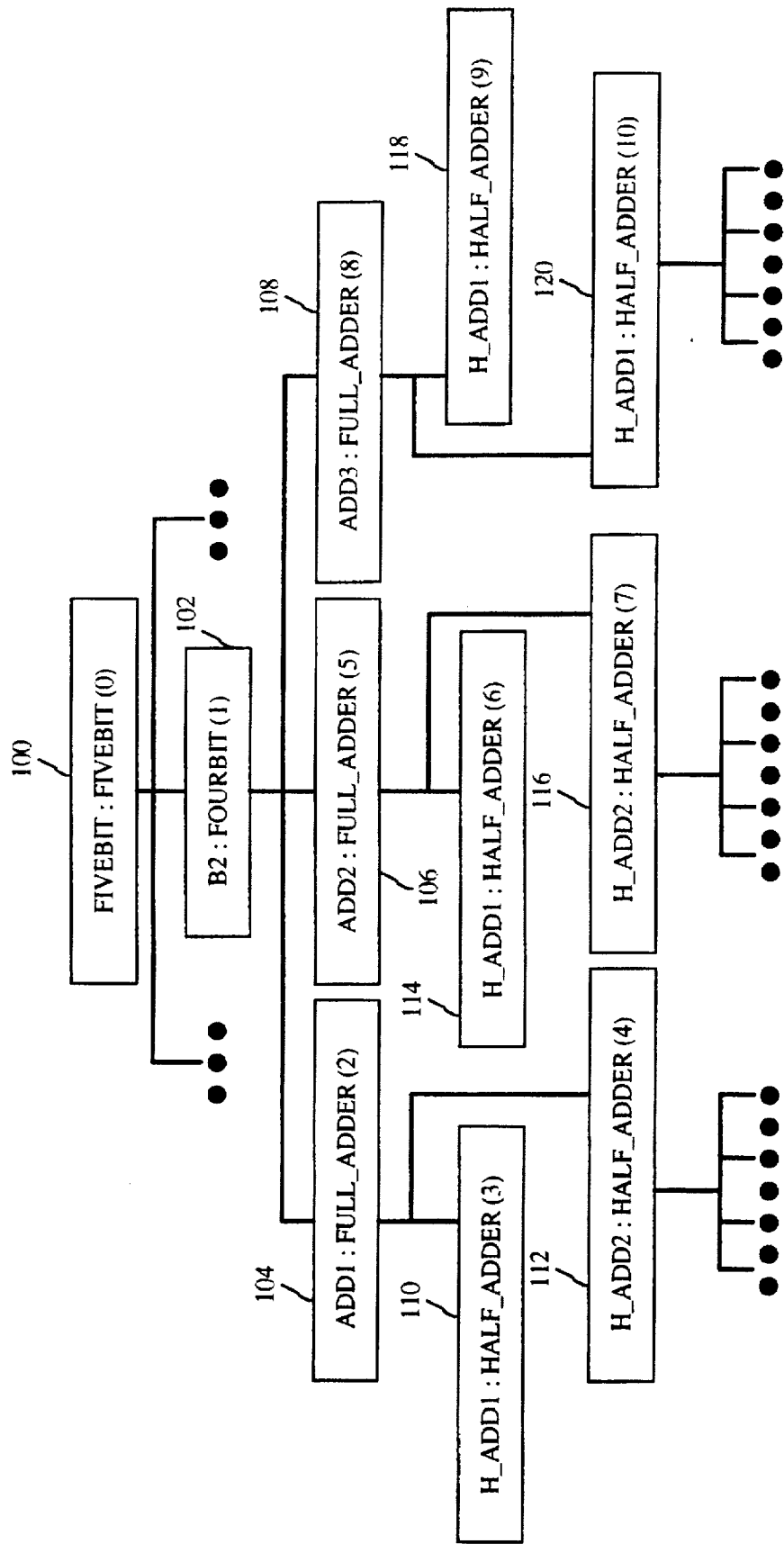
FIG. 7 is a block diagram of a portion of a sample logic function hierarchy.

FIG. 7 is a block diagram of a portion of a sample logic function hierarchy. The object called FIVEBIT 100 is a set of logic that a Designer has previously specified during the logic design process while using the Logic Design SW 22. It has been defined to accomplish some desired function on the completed ASIC chip. The FIVEBIT data object is stored in the Logic Function Design Database 24. The name of this object is FIVEBIT and its type is also FIVEBIT. It has been given an identifier of '0'. For example purposes, FIVEBIT is comprised of many other logic functions, one of which is B2 102. The object B2 is of type FOURBIT and has an identifier of '1'. B2 is comprised of three full adders ADD1 104, ADD2 106, and ADD3 108. Recall that the logic function hierarchy and portions thereof may be represented as a graph. For this simple example, FIVEBIT is the root of the graph. FIVEBIT has many child components, one of which is B2. B2's parent component is FIVEBIT, and its child components are ADD1 104, ADD2 106, and ADD3 108. It should be apparent to those skilled in the art that an arbitrarily large logic function hierarchy may be constructed by the Designer during the logic design process and a convenient way of representing the logical relationships among the logic functions is by using a graph.

The three full adders are, in turn, composed of identical logic functions. ADD1 104 is comprised of half adders H_ADD1 110 and H_ADD2 112, ADD2 106 is comprised of half adders H_ADD1 114 and H_ADD2 116, and ADD3 108 is comprised of half adders H_ADD1 118 and H_ADD2 120. Each half adder is comprised of various logic function cells that are leaves of the FIVEBIT graph. Note that the steps involved in placing H_ADD1 110 onto the ASIC chip are very similar to the steps involved in placing all of the other half adders because of their similar or identical structure. This fact is central to the implementation of planning by analogy.

Figure 8:
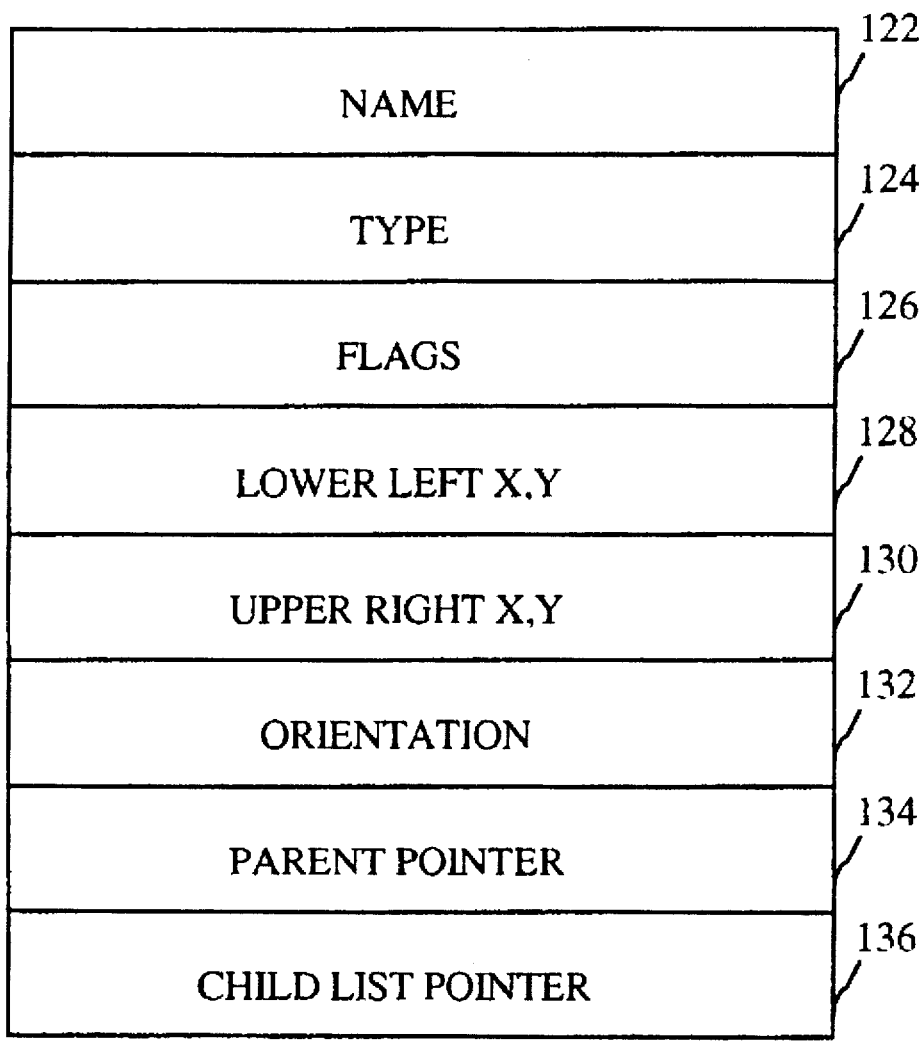
FIG. 8 is a diagram of the format of a data object in the Physical Design Database.

FIG. 8 is a diagram of the format of a data object in the Physical Design Database. Data objects are stored h the Physical Design Database in a data structure well-known in the programing art as a tree, which is a form of a graph. The Name field 122 is a text string storing the name of the logic function. In the example of FIG. 5, the root of the logic function hierarchy is called "FIVEBIT." The Type field 124 is a text string storing the type of logic function. For the FIVEBIT object, the type has been specified as "FIVEBIT." The Flags field 126 holds various control flags needed by the Plan By Analogy function to process the data object. The Lower Left X,Y field 128 and the Upper Right X,Y field 130 are integers specifying the coordinates of a rectangular area where the object has been placed on the ASIC chip. The Orientation field 132 is an integer code describing the orientation of the object. Possible orientations include the four reflection combinations discussed earlier. The Parent Pointer field 134 is a pointer to the object's parent component in the logic function hierarchy. The Child List Pointer field 136 is a pointer to a list of pointers to objects that are child components of the current object in the logic function hierarchy. The fields described above may be defined in the data object in any order.

The figures described below are shown to aid in the understanding of the present invention. They are examples of what the Designer sees on the Display 18 while using the Floor Planner SW 26 to effect the placement of logic functions using the Plan By Analogy technique. FIG. 9 is a display of an example of a portion of a logic design hierarchy using the Floor Planner SW. Note that it is a textual representation of the logic design shown in FIG. 7. FIG. 9 shows the FIVEBIT object and its underlying structure to the Designer. The first level of child objects within the FIVEBIT hierarchy is denoted by the "." symbol in the left-most column. Further definition of lower level objects is similarly denoted by ".." and "..." and so on. In this way a Designer can examine selected portions of the design hierarchy for possible placement decisions and consequently select objects to be placed. FIG. 10 is a display of leaf cells within a given selected logic hierarchical level shown in FIG. 9. FIG. 11 is a display of a list of placed logic functions. Once logic functions are placed, they may be used as source templates for further placement of other, analogous logic functions. The Designer may browse this list of placed logic functions to select suitable source logic functions. If the Designer needs further information relating to a placed logic function, the Floor Planner SW can display additional data to help the Designer make Plan By Analogy choices. FIG. 12 is a display of information relating to a placed logic function. This figure illustrates the various pieces of data kept in the Physical Design Database for the sample logic function called FIVEBIT. This region object has a height and width of 8096 units. Its placement coordinates are X1=243.50, Y1=243.50, and X2=8339.50, Y2=8339.50.

Figure 13:
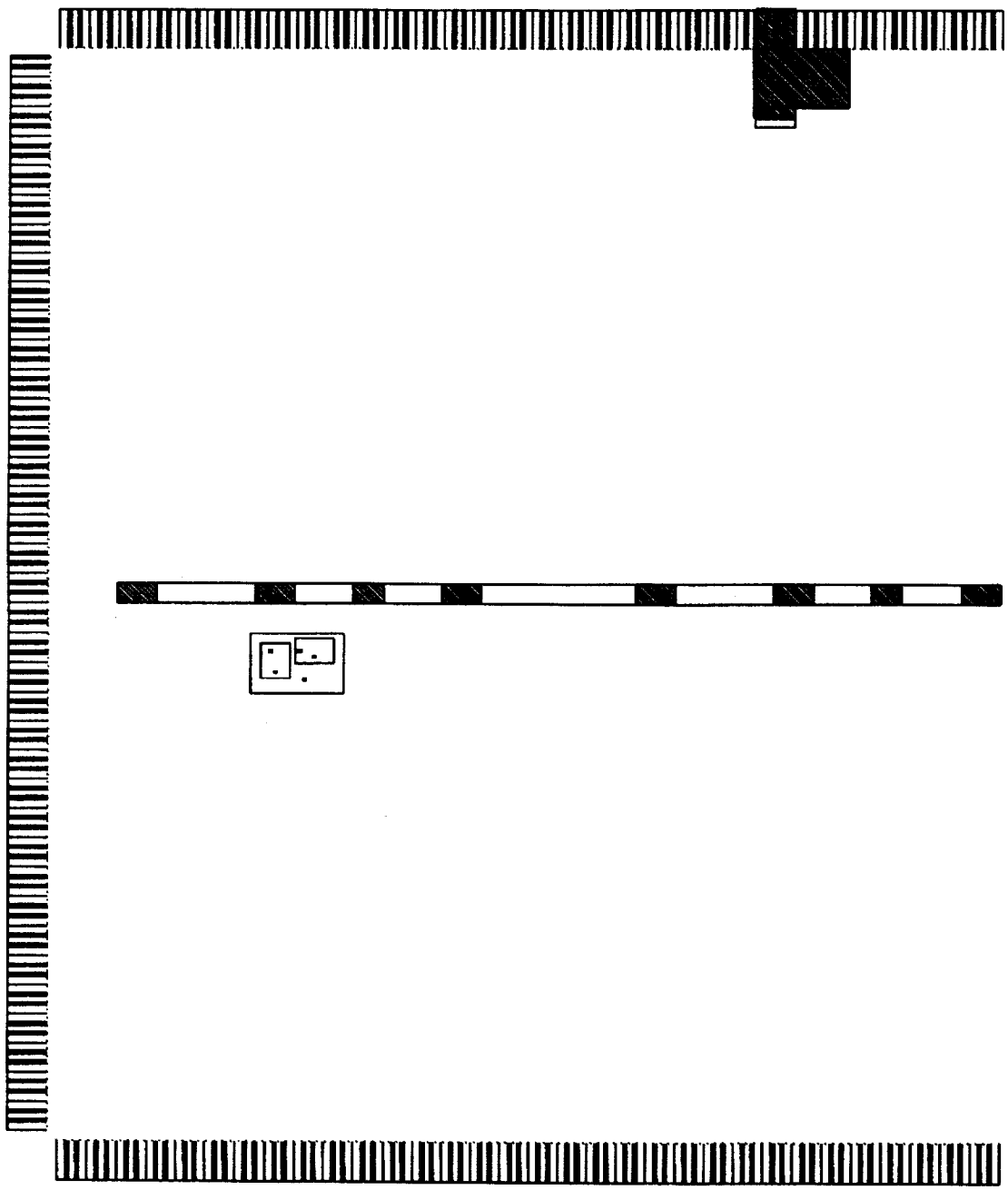
FIG. 13 is a display of the physical floor plan for a sample ASIC chip.
Figure 14:
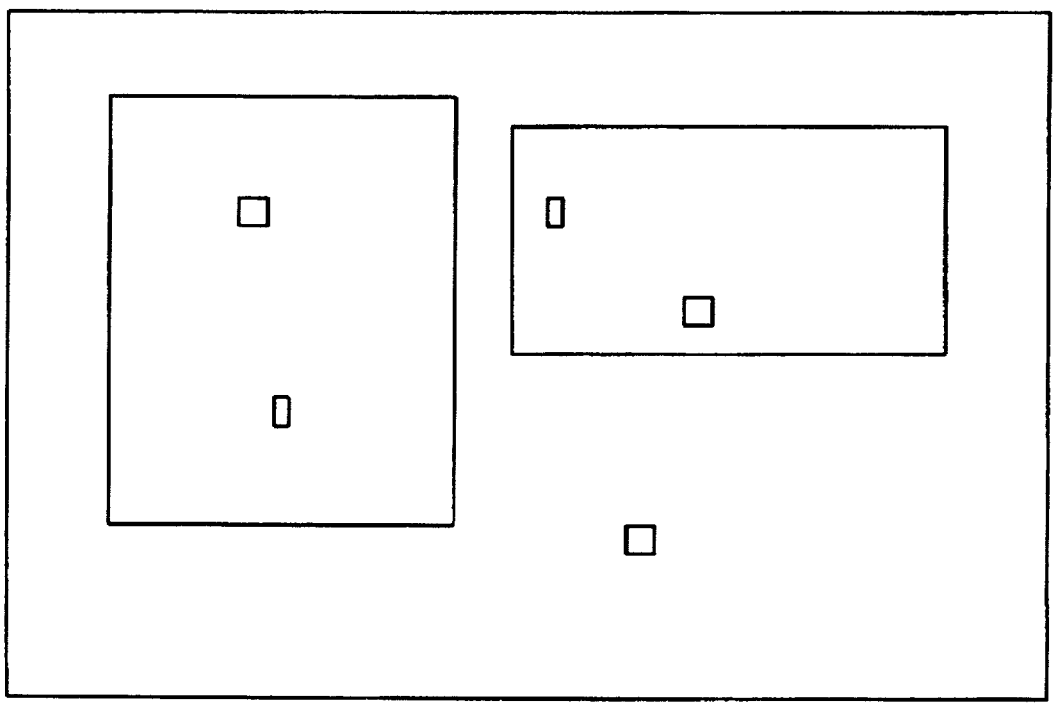
FIG. 14 is a display of a small section of the physical floor plan shown in FIG. 13.
Figure 15:
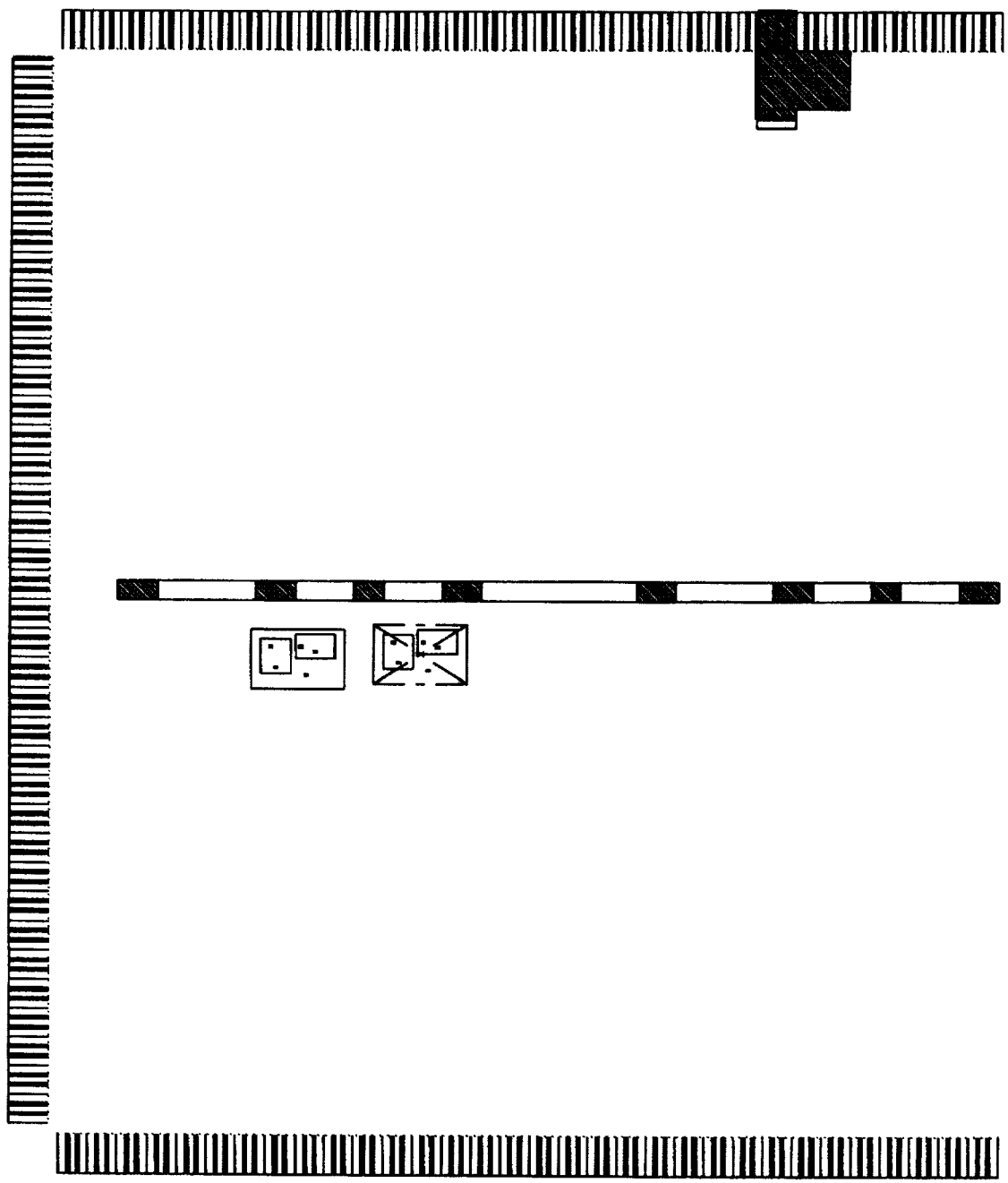
FIG. 15 is a display of the physical floor plan of a sample ASIC chip showing the use of Plan By Analogy.

FIG. 13 is a display of the physical floor plan for a sample ASIC chip. It is the representation of the ASIC chip that the Designer uses to interactively place selected logic functions. For example, a set of logic functions has been placed in the area delineated by the rectangular box shown in the lower left corner of the display. FIG. 14 is a display of a small section of the physical floor plan shown in FIG. 13. This figure shows the set of logic functions described in FIG. 13 but at a finer level of display granularity (i.e., the display has been "zoomed in"). The small rectangles within the larger area rectangle represent the regions and placed cells within a placed logic function. FIG. 15 is a display of the physical floor plan of a sample ASIC chip showing the use of Plan By Analogy. This figure is similar to FIG. 13, however, the Designer has defined the placed set of logic functions as a source template and requested planning by analogy to be performed. The resulting physical floor plan shows further placement of logic function cells that are analogous to the selected source template. FIG. 16 is a display of a small section of the physical floor plan shown in FIG. 15. The Plan By Analogy function has placed the selected target logic function at a Designer-specified location according to the source logic function template, without the Designer having to individually specify the placement of all constituent cells in the target logic function.

A method for placement of logic function cells in an integrated circuit design using a new technique called planning by analogy has been disclosed. This technique greatly reduces the time needed for a chip designer to manually place logic function cells on an ASIC. It also supports parallel design activities whereby multiple designers may work in parallel on the same chip's floor plan, using similar logic blocks. The method also allows chip designers to work across logic design hierarchies to Plan By Analogy similar structures occurring in different design hierarchies.

The invention has been described in its presently contemplated best mode, and clearly it is susceptible to various modifications, modes of operation and embodiments, all within the ability and skill of those skilled in the art and without the exercise of further inventive activity. Accordingly, what is intended to be protected by Letters Patent is set forth in the appended claims.

Appendix A

© 1995 Unisys Corporation.

```
5    //   $Header: TAnalogyTask.C,v 1.32 94/12/12 17:22:22 jer Exp $
     // include "CBuffer.h"
     #include "IMsgs.h"
10   #include "FMsgs.h"
     #include "GMsgs.h"
     #include "FLogic.h"
     #include "CRect.h"
     #include "Point.h"
15   #include "SList.h"
     #include "PNode.h"
     #include "FNode.h"
     #include "DDesign.h"
     #include "PromptView.h"
20   #include "AlertView.h"
     #include "VCompModel.h"
     #include "TAnalogyTask.h"
     #include "TSelectTask.h"
     #include "TContextTask.h"
25   #include "TScriptTask.h"
     #include "TUnPlaceTask.h"
     #include "THideWireTask.h"
     #include "FScope.h"
     #include "FTemplate.h"
30   #include "FWorkSpace.h"
     #include "FInstance.h"
     #include "TOverlapTask.h"
     #include "FGrSelect.h"
     #include "ChoiceView.h"
35   #include "FEmpty.h"
     #include "TechModel.h"

TAnalogyTask::TAnalogyTask(Logical b) : TTask(b)
         {
40        sourceLogic = NULL;
          targetLogic = NULL;
          sourceSelection = NULL;
          targetSelection = NULL;
          analogyType    = 0;
45        analogyFunc    = 0;
          planDefault = 0;
          moduleMode     = 0;
```

```
            sourceLayer = 0;
            analogyDrive = isFalse;
        }
        TAnalogyTask::~TAnalogyTask()
 5      {
            if (sourceLogic) delete sourceLogic;
            if (targetLogic) delete targetLogic;
        }
        FImage *TAnalogyTask::plan(int sfx,int sfy)
10      {
            int i,listlen;
            int srcSize;
            int targetSize;
            int lh,lw;
15          int mxFact,myFact;
            Logical tmpFrameOnContext,chgContext;
            FImage *currentContext;
            FImage *srcParallel;
            FImage *srcImage,*anImage;
20          FLogic *aRegion;
            FImage *srcContext;
            FImage *rootImage;
            FImage *rootContext;
            FImage *curContext;
25          FLogic *parRegion,*srcRegion;
            Pt baseSrc,baseTarget;
            Pt offSet;
            FList *targetStack,*srcStack;
            int driveMismatch;
30          FImage *newContext;
            int illegalPlaceCount = 0;
            newContext = NULL;
            mxFact = (sfx ==1)? 0:-1;
            myFact = (sfy ==1)? 0:-1;
35          chgContext = isFalse;
            if (moduleMode)
            { setSourceLogicModule();
              setTargetLogicModule();
            }
40          else
            {
            }
            srcSize = sourceLogic->size();
            targetSize = targetLogic->size();
45          listlen = srcSize<targetSize?srcSize:targetSize;

if (!srcSize)
            {
                Notifier->setTitle(" - - Analogy error - - ",mgsWhite);
```

27

```
                Notifier->setMsg("No Source specified",mgsWhite);
                Notifier->popAt(Pt(20,20));
                return(NULL );
            }
 5          if (!targetSize)
            {
                Notifier->setTitle(" - - Analogy error - - ",mgsWhite);
                Notifier->setMsg("No destination specified",mgsWhite);
                Notifier->popAt(Pt(20,20));
10              return(NULL );
            }
            if (srcSize!= targetSize )
            {   Notifier->setTitle(" - - Analogy error - - ",mgsWhite);
                Notifier->setMsg("MisMatching structures",mgsWhite);
15              Notifier->popAt(Pt(20,20));
                return(NULL);
            }
            driveMismatch = 0;
            for (i = 0;i<listlen;i++)
20          {   anImage = (FImage *) (targetLogic->getObj(i));
                srcImage = (FImage *) (sourceLogic->getObj(i));
                lh = anImage->imageKlass();
                lw = srcImage->imageKlass();
                switch(lh)
25              {   case xRegion:
                    case xWorkSpace:
                        if (anImage == context)
                            chgContext = isTrue;
                        break;
30                  case xPartition:
                        if (((PNode *)anImage)->region == context)
                            chgContext = isTrue;
                        break;
                }
35              if (lh == xInstance || lw == xInstance)
                {
                    if (lw != lh)
                    {   Notifier->setTitle(" - - Analogy error - - ",mgsWhite);
                        Notifier->setMsg("MisMatching structures",mgsWhite);
40                      Notifier->popAt(Pt(20,20));
                        return(NULL);
                    }
                    if (strcmp(srcImage->object->templ->name,anImage->object->templ->name))
                        driveMismatch++;
45              }
            }
            if (driveMismatch&& !gScriptTask->scriptMode)
            {   analogyDrive = isTrue;
                Confirmer->setTitle("Chip Plan ",mgsRed);
```

```
         sprintf(gString,
            "%d cells found with misMatched drive strengths. / Copy drive strengths?",
            driveMismatch);
         Confirmer->setMsg(gString,mgsWhite);
 5       if( !Confirmer->popAt(Pt(20,20)))
            analogyDrive = isFalse;
         }
         tmpFrameOnContext = gTechModel->FrameOnContext;
         gTechModel->FrameOnContext = isFalse;
10       currentContext = context;
         curContext = context;
         gSelectTask->select(NULL);
         if (chgContext)
         { if (context->imageKlass() == xRegion)
15          curContext = ((FLogic *)context)->partition;
           gContextTask->setUp((ClientData)gERegion,NULL);
           gContextTask->doIt();
         }
         anImage = (FImage *) (targetLogic->getObj(0));
20       srcImage = (FImage *) (sourceLogic->getObj(0));
         rootImage = targetSelection;
         srcContext = sourceSelection->parent;
         if (rootImage->imageKlass() == xRegion)
         {
25          rootImage = ((FLogic *) rootImage)->partition;
            theModel->changed(delImage,(ClientData)targetSelection,NULL);
            theModel->changed(iErase,(ClientData)targetSelection,NULL);
            if (moduleMode)
            {
30            currentContext = anImage->parent;
              anImage = ((FLogic*)targetSelection)->partition;
              gUnPlaceTask->unPlaceIt(targetSelection);
              // theModel->changed(iUpdateXObject,(ClientData)currentContext,NULL);
              targetSelection = anImage;
35            setTargetLogicModule();
            }
         }
         else
         if (rootImage->imageKlass() == xWorkSpace)
40       {
            rootImage = ((FLogic *) rootImage)->partition;
            if (moduleMode)
            {
              currentContext = anImage->parent;
45            aRegion = (FLogic *) targetSelection;
              anImage = aRegion->partition;
              if(aRegion->contents)
              { doEnumP( aRegion->contents,FImage,member)
                {
```

29

```
                    gUnPlaceTask->unPlaceIt(member);
                }
            }
            setTargetLogicModule();
 5      }
    }
    baseSrc = ((FLogic *) srcImage)->mbb.lower;
    baseTarget = clickPt;
    if (gTechModel->flipInPlace)
10  {   if (mxFact)
            baseTarget.x += ((FLogic *) srcImage)->mbb.width();
        if (myFact)
            baseTarget.y += ((FLogic *) srcImage)->mbb.height();

15  }
    rootContext = currentContext;
    targetStack = new FList();
    srcStack = new FList();
    targetStack->push( currentContext);
20  srcStack->push( srcContext);
    for (i = 0;i<listlen;i++)
    {   anImage = (FImage *) (targetLogic->getObj(i));
        srcImage = (FImage *) (sourceLogic->getObj(i));
        srcRegion = (FLogic *) srcImage;
25      while (srcImage->parent != srcContext)
        {
          switch (srcContext->imageKlass())
          {  case xRegion:
             case xWorkSpace:
30              srcParallel = ((FLogic *)srcContext)->partition;
                break;
             case xPartition:
                srcParallel = ((PNode *)srcContext)->region;
                break;
35           default:
                srcParallel = NULL;
                break;
          }
          if (srcParallel == srcImage->parent)
40          break;
          currentContext = targetStack->pop();
          srcContext =   srcStack->pop();
        }
        switch (srcImage->imageKlass())
45      {
           case xInstance:
              {
                 FInstance* anInst = (FInstance*) anImage;
                 if (srcImage->testFlag(iPlaced))
```

```
    {
    if( anImage->testFlag(iPlaced) && !planDefault)
        theModel->changed(iErase,(ClientData)anImage,NULL);
    if (strcmp(srcImage->object->templ->name,anImage->object->templ->name))
        if (analogyDrive)
            anInst->changeDrive(srcImage->object->templ->name,isFalse);

offSet = ((FInstance*)srcImage)->aRef.origin - baseSrc;
    offSet.x *= sfx;
    offSet.y *= sfy;
    offSet += baseTarget;

if (currentContext != anImage->parent)
    {   anImage->clearFlag(iPlaced);

((FLogic *)currentContext)->removeLogic(anImage);

currentContext->placeAt(anImage,offSet);
        parRegion= (FLogic*)currentContext->perform(iFindRegion,NULL,NULL);
        if(parRegion )
            parRegion->perform(iIncrement,(ClientData)anImage,NULL);
    }
    else
        anImage->moveTo(offSet);

anInst->aRef.angle = ((FInstance*) srcImage)->aRef.angle;
    anInst->aRef.refl = ((FInstance*) srcImage)->aRef.refl;
    anInst->clearFlag(fLayoutPlaced);
    if (sfx == -1 && sfy == -1) {
        anInst->aRef.mirrorAboutXY();
    } else if (sfx == -1) {
        anInst->aRef.mirrorAboutY();
    } else if (sfy == -1) {
        anInst->aRef.mirrorAboutX();
    } anInst->orient(anInst->angle(), anInst->refl());

if (!anInst->legalOrient())
        illegalPlaceCount++;

if (!planDefault)
        theModel->changed(iDraw,(ClientData)anImage,NULL);
    }
    else
    if (strcmp(srcImage->object->templ->name,anImage->object->templ->name))
        if (analogyDrive)
            anInst->changeDrive(srcImage->object->templ->name,isFalse);
```

```
                }
                break;
            case xPartition:
                {
                    targetStack->push(currentContext);
                    srcStack->push(srcContext);
                    srcContext = srcImage;
                    if (anImage->imageKlass() == xRegion)
                    {
                        currentContext = ((FLogic *)anImage)->partition;
                        if (!planDefault)
                            theModel->changed(iErase,(ClientData)anImage,NULL);
                    }
                    else
                    {
                        currentContext = anImage;
                    }
                }
                break;
            case xWorkSpace:
            case xRegion:
                {
                    offSet = srcRegion->mbb.lower - baseSrc;
                    lw = srcRegion->width();
                    lh = srcRegion->height();
                    offSet.x *= sfx;
                    offSet.y *= sfy;
                    offSet.x += (mxFact *lw);
                    offSet.y += (myFact * lh);
                    offSet += baseTarget;
                    targetStack->push(currentContext);
                    srcStack->push(srcContext);
                    srcContext = srcImage;
                    if (anImage->imageKlass() == xRegion ||
                        anImage->imageKlass() == xWorkSpace)
                    {   aRegion = (FLogic *) anImage;
                        if (!planDefault)
                            theModel->changed(iErase,(ClientData)anImage,NULL);
                        aRegion->mbb.setExtent(lw,lh);
                        aRegion->moveTo(offSet);
                        aRegion->clearFlag(fLayoutPlaced);
                        anImage->clearFlag(fShowText);
                        if (!planDefault)
                            theModel->changed(iDraw,(ClientData)anImage,NULL);
                        currentContext = anImage;
                    }
                    else
                    {
```

```
                    aRegion   = new FLogic();

//..initialize the region..
                    //.. set the composer
 5                  //.. inherit the name of the logical partition
                    //.. then add/remove the partition aRegion->composeTo( gCompModel->get("region") );
                    freeStr(aRegion->name);
10                  copyStr(aRegion->name,anImage->name);
                    ((FLogic*)currentContext)->removeLogic(anImage);
                    aRegion->addLogic(anImage);
                    aRegion->overhead = srcRegion->overhead;
                    aRegion->compOption = srcRegion->compOption;
15                  aRegion->mbb.setExtent(lw,lh);
                    currentContext->placeAt(aRegion,offSet);
                    aRegion->clearFlag(fCollapsed);
                    aRegion->clearFlag(fLayoutPlaced);
                    aRegion->clearFlag(fShowText);
20                  aRegion->setFlag(fRegion);
                    //          if (srcImage == newContext)
                    // newContext = (FImage *) aRegion;
                    parRegion= (FLogic*)currentContext->perform(iFindRegion,NULL,NULL);
                    if(parRegion)
25                     parRegion->perform(iIncrement,(ClientData)anImage,NULL);
                    if (!planDefault)
                       theModel->changed(iDraw,(ClientData)aRegion,NULL);
                    currentContext = (FImage *) aRegion;
                    }
30                  }
                   break;
               }

}
35         if (illegalPlaceCount) {
               Notifier->setTitle(" - - Analogy error - - ",mgsWhite);
               sprintf(gString,"%d Cells have illegal orientations.",illegalPlaceCount);
               Notifier->setMsg(gString,mgsWhite);
               Notifier->popAt(Pt(20,20));
40         } targetSelection = ((PNode *)rootImage)->region;
           delete srcStack;
           delete targetStack;
45         if (chgContext)
           {  if (curContext->imageKlass() == xPartition)
                   curContext = ((PNode *)curContext)->region;
              if (!curContext) curContext = gWorkSpace;
              selection = curContext;
```

```
            gContextTask->setUp((ClientData)curContext,NULL);
            gContextTask->doIt();
        }

5      gTechModel->FrameOnContext = tmpFrameOnContext ;
        if (planDefault)
            return(sourceSelection);
        parRegion = (FLogic *) targetSelection->perform(iFindRegion,NULL,NULL);
        theModel->changed(iUpdateXObject,(ClientData)parRegion,NULL);
10      if (rootContext)
            theModel->changed(iUpdateXObject,(ClientData)rootContext,NULL);
        return (targetSelection);
    }

15  //=============================================================
    // Analogy TASK requires two regions: context and selection
    // and within each a selection of a partition..
    // The parMode defines what is to be done from the source
    // partition to the target partition.
20  //============================================================= void TAnalogyTask::dumpToBuffer(CBuffer* aBuffer,FImage* aNode,int form)
    {
        char string[1024];
25      char*c = string;
        PNode* aPar;
        FLogic *aRegion;
        FImage *aImage;
        int lvl;
30      if( !aNode ) return;

lvl = aNode->getLevel();
        switch( aNode->imageKlass() )
        {
35      case xInstance:
            {
                FNode* aGate = aNode->object;
                for(int i= 0; i < lvl; i++) *c++ = '.';
                *c++ = ' ';
40              *c = '\0';
                strcat(string, aGate->printToString(form,0,0));
                aBuffer->printObj("",string,0,aNode);
            }
            break;
45      case xWorkSpace:
        case xRegion:
            {   aRegion = (FLogic *) aNode;
                aPar = (PNode *) aRegion->partition;
                for(int i= 0; i < lvl; i++) *c++ = '.';
```

```
                *c = '\0';
                strcat(string, aPar->printToString(form,0,0));
                aBuffer->printObj("",string,0,aNode);
                OList* aList = aPar->siblings();
                if( aList )
                { doEnumP(aList,FImage,theNode)
                  { dumpToBuffer(aBuffer,theNode,form); }
                }
                if (aRegion->items())
                { FList *rList = aNode->content();
                  rList->enumInit();
                  while (aImage = rList->enumDo())
                  { dumpToBuffer(aBuffer,aImage,form);
                  }
                }
            }
            break;

case xPartition:
            {
                aPar = (PNode*)aNode;
                for(int i= 0; i < lvl; i++) *c++ = ' ';
                *c = '\0';
                strcat(string, aPar->printToString(form,0,0));
                aBuffer->printObj("",string,0,aNode);
                OList* aList = aPar->siblings();
                if( aList )
                { doEnumP(aList,FImage,theNode)
                  { dumpToBuffer(aBuffer,theNode,form); }
                }
            }
            break;
        default:
            break;
        }
    } void TAnalogyTask::setSourceLogicModule( )
{   if (sourceLogic) delete(sourceLogic);
    sourceLogic= new CBuffer();
    self->dumpToBuffer(sourceLogic,sourceSelection,formInst);
    sourceLogic->sort(formInst);
    //   sourceLogic->print();
}
void TAnalogyTask::setTargetLogicModule()
{   if (targetLogic) delete(targetLogic);
    targetLogic= new CBuffer();
    self->dumpToBuffer(targetLogic,targetSelection,formInst);
    targetLogic->sort(formInst);
```

```
            //    targetLogic->print();
        } void TAnalogyTask::setAnalogyMode(int m)
 5      {
            switch (m)
            {
                case iAnalogySrcNode:
                case iAnalogySrcList:
10              case iAnalogyDestList:
                case iAnalogyClearSrc:
                case iAnalogyRead:
                case iAnalogyWrite:
                case iRemoveDesign:
15                  analogyFunc = m;
                    break;

case iAnalogyPlace:
                case iAnalogyPlaceMx:
20              case iAnalogyPlaceMy:
                case iAnalogyPlaceMxy:
                    targetSelection = NULL;
                    analogyType = m;
                    analogyCursor = CursorManager->cursor(XC_target);
25                  theModel->changed(iTempCursor, (ClientData) &analogyCursor, NULL);
                    break;
                case iAnalogyOff:
                    targetSelection = NULL;
                    analogyType = m;
30                  theModel->changed(iResetCursor, NULL, NULL);
                    break;
            }
        }

35      void TAnalogyTask::clearSource(FImage *anImage)
        { if (anImage == sourceSelection)
            { analogyFunc = iAnalogyClearSrc;
              targetSelection = NULL;
              sourceSelection = NULL;
40            // self->doIt();
            }
        }

Logical TAnalogyTask::doIt()
45      {
            char *srcNode ;
            FScope *aScope;
            FImage *aSelect;
            FWorkSpace *aWorkSpace;
```

```
        FImage *oldSelection;
        Logical ok;
        int oldFunc;
        if(!TTask::doIt()) return(isFalse);
 5      ok = isTrue;
        switch(analogyFunc)
        {
           case iAnalogySrcNode:
              if (sourceSelection != NULL&&
10               sourceSelection->imageKlass() != xWorkSpace)
              {
                 sourceSelection->setLayer(sourceLayer);
                 theModel->changed(iDraw,(ClientData)sourceSelection,NULL);
              }
15            sourceSelection = NULL;
              if (selection->imageKlass() != xRegion )
                 break;
              sourceSelection = selection;
              targetSelection = NULL;
20            if (sourceSelection != NULL)
              {  sourceLayer = sourceSelection->getLayer();
                 sourceSelection->setLayer(61);
                 theModel->changed(iDraw,(ClientData)sourceSelection,NULL);
              }
25            moduleMode = 1;
              break;
           case iAnalogyClearSrc:
              if (sourceSelection != NULL &&
                 sourceSelection->imageKlass() != xWorkSpace)
30            {
                 sourceSelection->setLayer(sourceLayer);
                 theModel->changed(iDraw,(ClientData)sourceSelection,NULL);

}
35
              targetSelection = NULL;
              sourceSelection = NULL;
              break;
           case iAnalogySrcList:
40         case iAnalogyDestList:
              break;
           case iAnalogyRead:
              setDefault(selection);
              break;
45         case iRemoveDesign:
              aSelect = selection;
              switch(selection->imageKlass())
              {  case xRegion:
                    aSelect = ((FLogic *) selection)->partition;
```

```
               // THIS CASE is intended to fall Through
               case xPartition:
                  aScope = (FScope *) ((PNode *) aSelect)->object;
                  srcNode = aScope->className;
 5                gDDesign->removeDesign(srcNode);
                  break;
               }
               sourceSelection = NULL;
               break;
10             case iAnalogyWrite:
                  if (sourceSelection == NULL)
                  {
                     Notifier->setTitle(" - - Analogy error - - ",mgsWhite);
                     Notifier->setMsg("No Source specified",mgsWhite);
15                   Notifier->popAt(Pt(20,20));
                     break;
                  }
                  gOverlapTask->overlapRegion = sourceSelection;
                  if (gOverlapTask->doIt()) {
20                   Confirmer->setTitle("Chip Plan ",mgsRed);
                     Confirmer->setMsg("Overlapping cells exist in the source. / Write source to
      ACADS?",mgsWhite);
                     if( !Confirmer->popAt(Pt(20,20)))
                        ok = isFalse;
25                }
                  if (ok)
                  {
                     aScope = (FScope *) ((FLogic *)sourceSelection)->partition->object;
                     srcNode = aScope->className;
30                   aWorkSpace = gDDesign->lookUpDesign(srcNode);
                     targetSelection =(FImage *) aWorkSpace;
                     clickPt = sourceSelection ->mbb.lower;
                     if ( targetSelection == sourceSelection)
                     {
35                      Notifier->setTitle(" - - Analogy error - - ",mgsWhite);
                        Notifier->setMsg("Can not write a default with source as default",mgsWhite);
                        Notifier->popAt(Pt(20,20));
                        break;
                     }
40                   planDefault = 1;
                     oldSelection = selection;
                     if (plan(1,1))
                     {
                        aWorkSpace->hasPlan = 1;
45                      gDDesign->writeDesign(srcNode);
                     }
                     oldFunc = analogyType;
                     analogyType = 0;
                     gSelectTask->select(oldSelection);
```

38

```
                  analogyType = oldFunc;
                  planDefault = 0;
                }
              break;
 5          default: break;
          }
        return(isTrue);
      }

10    FImage *TAnalogyTask::analogyMode(FImage * anImage,Pt &at)
      {
        char *srcNode,*targetNode;
        FScope *aScope;
        FImage *aGrp;
15      FImage *aGrpImage;
        FImage *aResult;
        FList *aTmpList;
        Pt placePt;
        FList *aGrpList;
20      if( anImage->imageKlass() == xGrSelect )
        { aGrp = anImage;
          aTmpList = new FList();
          aGrpList = aGrp->content();
          while((aGrpImage=aGrpList->pop()))
25            aTmpList->add(aGrpImage);
          aGrpList = aGrp->content();
          while((aGrpImage=aTmpList->pop()))
          { aResult = NULL;
            if (aGrpImage->imageKlass() == xRegion)
30          {
                placePt = ((FLogic *) aGrpImage)->mbb.lower;
                aResult =analogyMode( aGrpImage, placePt) ;
            }
            aGrpList->add(aResult?aResult:aGrpImage);
35        }
          delete aTmpList;
          gGrSelect->calculateBox();
          return(aGrp);
        }
40      if (anImage ==NULL || sourceSelection == NULL)
            return(NULL);
        if (anImage == targetSelection || anImage == sourceSelection)
            return (NULL);
        srcNode = NULL;
45      targetNode = NULL;
        clickPt = at;
        switch (anImage->imageKlass())
        { case xRegion:
          case xWorkSpace:
```

```
            aScope = (FScope *) ((FLogic *)anImage)->partition->object;
            targetNode = aScope->className;
            break;
        case xPartition:
5           aScope = (FScope *) ((PNode *)anImage)->object;
            targetNode = aScope->className;
            break;
        case xInstance:
    //      aNode = (FNode *) anImage->object;
10  //          targetNode = aNode->templ->name;
    //cout << " we got there for " << targetNode << endl;
            break;
        }
        switch (sourceSelection->imageKlass())
15      {   case xRegion:
            case xWorkSpace:
                aScope = (FScope *) ((FLogic *)sourceSelection)->partition->object;
                srcNode = aScope->className;
                break;
20          case xPartition:
                aScope = (FScope *) ((PNode *)sourceSelection)->object;
                srcNode = aScope->className;
                break;
            case xInstance:
25  //          aNode = (FNode *)((FInstance *)sourceSelection)->object;
    //          srcNode = aNode->templ->name;
    //cout << " we got there for " << srcNode << endl;
            break;
        }
30      if (srcNode == NULL || targetNode == NULL)
            return(NULL);
        if (strcmp(targetNode,srcNode))
            return (NULL);
        switch(analogyType)
35      {   case iAnalogyPlace:
            targetSelection = anImage;
            return(plan(1,1));
        case iAnalogyPlaceMx:
            targetSelection = anImage;
40          return(plan(-1,1));
        case iAnalogyPlaceMy:
            targetSelection = anImage;
            return(plan(1,-1));
        case iAnalogyPlaceMxy:
45          targetSelection = anImage;
            return(plan(-1,-1));
        default:
            return (NULL);
        }
```

```
         return(NULL);
      }
      void TAnalogyTask::setDefault(FImage *select)
      {
 5       char *srcNode ;
         FScope *aScope;
         FImage *aSelect;
         FWorkSpace *aWorkSpace;
         if (sourceSelection != NULL &&
10          sourceSelection->imageKlass() != xWorkSpace )
         {
            sourceSelection->setLayer(sourceLayer);
            theModel->changed(iUpdateXObject,(ClientData)sourceSelection,NULL);
         }
15       sourceSelection = NULL;
         if (select == NULL)
            return;
         aSelect = select;
         switch(select->imageKlass())
20       {
            case xRegion:
               aSelect = ((FLogic *) select)->partition;
               // THIS CASE is intended to fall Through
            case xPartition:
25             aScope = (FScope *) ((PNode *) aSelect)->object;
               srcNode = aScope->className;
               aWorkSpace = gDDesign->lookUpDesign(srcNode);
               sourceSelection =(FImage *) aWorkSpace;
               moduleMode = 1;
30             if (gScriptTask->scriptMode)
                  break;
               if (!aWorkSpace->hasPlan)
               {
                  Notifier->setTitle(" - - Analogy error - - ",mgsWhite);
35                Notifier->setMsg("Selection does not have plan ",mgsWhite);
                  Notifier->popAt(Pt(20,20));
                  sourceSelection = NULL;
               }
               else
40             {
                  Notifier->setTitle(" - - Analogy - - ",mgsWhite);
                  Notifier->setMsg("Selection plan Has been Read ",mgsWhite);
                  Notifier->popAt(Pt(20,20));
               }
45             break;
            default:
               if (gScriptTask->scriptMode)
                  break;
               Notifier->setTitle(" - - Analogy error - - ",mgsWhite);
```

```
            Notifier->setMsg("No selection to read",mgsWhite);
            Notifier->popAt(Pt(20,20));
            break;
        }
5   }
    Logical TAnalogyTask::undoIt()
    {
      return(isFalse);
    }
10
    void TAnalogyTask::objDelete(int /*from_destructor*/, ClientData ptr)
    { delete ((TAnalogyTask*)ptr); }
```

We claim:

1. In a system for designing an integrated circuit chip, the integrated circuit chip design having logic functions composed of cells, the logic functions and cells being specified in at least one logic design hierarchy structured as a graph and stored in a database, logic functions being represented as non-leaf nodes in the graph and cells being represented as leaf nodes in the graph, the graph having sub-graphs, each sub-graph having a root node representing a logic function, the logic functions and cells being assigned to physical positions in a floor plan of the integrated circuit chip, the system including an automatic placement system for accepting placement directives, and the floor plan including areas on the integrated circuit chip called placement regions, a computer-implemented method for placing logic functions and cells in a floor plan comprising the steps of:

(a) setting an orientation mode indicating an orientation of physical placement of a logic function or cell;

(b) selecting a first set of nodes in the logic design hierarchy that have been previously placed in the floor plan or previously stored in the database;

(c) selecting a second set of nodes in the logic design hierarchy for placement in the floor plan;

(d) comparing said first set of nodes to said second set of nodes, and returning to step (b) when said first set of nodes and said second set of nodes are non-analogous; and (e) placing said second set of nodes in the floor plan, said placing step comprising the steps of (e1) selecting a target node from said second set of nodes;

(e2) locating a node in the logic design hierarchy which is the parent of said target node;

(e3) updating the physical position of said target node in the floor plan according to said orientation mode and according to the physical position of a source node in said first set of nodes corresponding to said target node when said source node is an absolutely placed leaf node;

(e4) assigning said target node to a placement region in the floor plan and updating a placement directive for said target node when said source node is a region-placed node; and (e5) leaving said target node unplaced when said source node is unplaced.

2. The computer-implemented method of claim 1, wherein said first set of nodes and said second set of nodes are selected from different logic design hierarchies.

3. The computer-implemented method of claim 1, wherein said comparing step (d) comprises the step of verifying that the number of nodes in said first set of nodes equals the number of nodes in said second set of nodes.

4. The computer-implemented method of claim 3 wherein said comparing step (d) further comprises the step of verifying that nodes in said first set of nodes and nodes in said second set of nodes have analogous parent-child relationships.

5. The computer-implemented method of claim 1, wherein updating step (e3) comprises the steps of:

calculating an offset for said corresponding node from the physical position of the root node of the sub-graph in the logic design hierarchy representing said first set of nodes;

reflecting said offset for said corresponding node according to said orientation mode;

calculating a physical position of said target node based on said offset and the physical position of the root node of the sub-graph in the logic design hierarchy representing said second set of nodes; and updating said target node's placement location and orientation.

6. The computer-implemented method of claim 5, further including the step of displaying said target node's placement.

7. The computer-implemented method of claim 5, wherein said reflecting step includes reflecting said offset about the horizontal axis, reflecting said offset about the vertical axis, reflecting said offset about both the horizontal axis and the vertical axis, or not reflecting said offset according to said orientation mode.

8. The computer-implemented method of claim 1, wherein updating step (e4) comprises the steps of:

calculating an offset of said corresponding node from the physical position of the root node of the sub-graph in the logic design hierarchy representing said first set of nodes;

reflecting said offset according to said orientation mode;

calculating a physical position of a placement region in the floor plan for said target node from said offset and the physical position of the root node of the sub-graph in the logic design hierarchy representing said second set of nodes; and updating said selected target node's placement region.

9. The computer-implemented method of claim 8, wherein said reflecting step includes reflecting said offset about the horizontal axis, reflecting said offset about the vertical axis, reflecting said offset about both the horizontal axis and the vertical axis, or not reflecting said offset according to said orientation mode.

10. The computer-implemented method of claim 8, further including the step of building a data structure for storing said target node's placement region information.

11. The computer-implemented method of claim 10, further including the step of displaying said target node's placement region.

12. In a computer-aided design system for designing a very large scale integrated (VLSI) circuit chip, the VLSI circuit chip design having logic functions composed of cells, the logic functions and cells being specified in at least one logic design hierarchy structured as a graph and stored in a database, logic functions being represented as non-leaf nodes in the graph and cells being represented as leaf nodes in the graph, the graph having sub-graphs, each sub-graph having a root node representing a logic function, the logic functions and cells being assigned to physical positions in a floor plan of the VLSI circuit chip, the computer-aided design system including an automatic placement system for accepting placement directives, and the floor plan including areas on the VLSI circuit chip called placement regions, a computer-implemented method for placing logic functions and cells in a floor plan comprising the steps of:

(a) setting an orientation mode indicating an orientation of physical placement of a logic function or cell;

(b) selecting at least one source node in the logic design hierarchy that has been previously placed in the floor plan or previously stored in the database;

(c) selecting at least one target node in the logic design hierarchy for placement in the floor plan;

(d) building a sorted source list including said at least one source node;

(e) building a sorted target list including said at least one target node;

(f) comparing said sorted source list to said sorted target list, and returning to step (b) when said sorted source list and said sorted target list are non-analogous;

(g) deleting any pre-existing placement directives for target nodes in said sorted target list; and (h) placing every target node of said sorted target list in the floor plan, said placing step comprising the steps of (h1) selecting a target node from said sorted target list;

(h2) locating a node in the logic design hierarchy which is the parent of said selected target node;

(h3) updating the physical position of said selected target node in the floor plan according to said orientation mode and the physical position of a source node in said sorted source list corresponding to said selected target node when said source node is an absolutely placed leaf node;

(h4) assigning said selected target node to a placement region in the floor plan and updating the placement directive for said selected target node when said source node is a region-placed node; and (h5) leaving said selected target node unplaced when said source node is unplaced.

13. The computer-implemented method of claim 12, wherein said at least one source node and said at least one target node are selected from different logic design hierarchies.

14. The computer-implemented method of claim 12, wherein said comparing step (f) comprises the step of verifying that the number of source nodes in said sorted source list equals the number of target nodes in said sorted target list.

15. The computer-implemented method of claim 14 wherein said comparing step (f) further comprises the step of verifying that source nodes in said sorted source list and target nodes in said sorted target list have analogous parent-child relationships.

16. The computer-implemented method of claim 12, wherein updating step (h3) comprises the steps of:

(a) calculating an offset for said corresponding source node from the physical position of the root node of the sub-graph in the logic design hierarchy representing source nodes in said sorted source list;

(b) reflecting said offset for said corresponding source node according to said orientation mode;

(c) calculating a physical position of said selected target node based on said offset and the physical position of the root node of the sub-graph in the logic design hierarchy representing target nodes in said sorted target list;

(d) updating said selected target node's placement location and orientation; and (e) displaying said selected target node's placement.

17. The computer-implemented method of claim 16, wherein said reflecting step includes reflecting said offset about the horizontal axis, reflecting said offset about the vertical axis, reflecting said offset about both the horizontal axis and the vertical axis, or not reflecting said offset according to said orientation mode.

18. The computer-implemented method of claim 12, wherein updating step (h4) comprises the steps of:

(a) calculating an offset of said corresponding source node from the physical position of the root node of the sub-graph in the logic design hierarchy representing source nodes in the sorted source list;

(b) reflecting said offset according to said orientation mode;

(c) calculating a physical position of a placement region in the floor plan for said selected target node from said offset and the physical position of the root node of the sub-graph in the logic design hierarchy representing target nodes in said sorted target list;

(d) building a data structure for storing said selected target node's placement region information;

(e) updating said selected target node's placement region; and (f) displaying said selected target node's placement region.

19. The computer-implemented method of claim 18, wherein said reflecting step includes reflecting said offset about the horizontal axis, reflecting said offset about the vertical axis, reflecting said offset about both the horizontal axis and the vertical axis, or not reflecting said offset according to said orientation mode.

20. A computer system for placing logic functions and cells in a floor plan of a design for an integrated circuit chip, the integrated circuit chip design having logic functions composed of cells specified in a logic design hierarchy, the logic design hierarchy being represented as a graph structure, logic functions being represented as non-leaf nodes in the graph structure and cells being represented as leaf nodes in the graph structure, the graph structure having sub-graphs each having a root node representing a logic function, the floor plan having areas on the integrated circuit chip called placement regions, the system including an automatic placement system for accepting placement directives, and comprising:

means for setting an orientation mode, said orientation mode indicating an orientation of physical placement in the floor plan of a logic function or cell;

first selection means for selecting a first set of nodes in the logic design hierarchy that have been previously placed in the floor plan, said first set of nodes capable of including both leaf nodes and non-leaf nodes;

second selection means for selecting a second set of nodes in the logic design hierarchy for placement in the floor plan, said second set of nodes capable of including both leaf nodes and non-leaf nodes;

comparison means for comparing said first set of nodes to said second set of nodes to determine if the number of said first set of nodes is the same as the number of said second set of nodes and to determine if the graph structure of said first set of nodes is the same as the graph structure of said second set of nodes; and placement means for placing said second set of nodes in the floor plan according to said first set of nodes and said orientation mode, and for updating placement directives for said second set of nodes.

21. The computer system of claim 20 wherein said placement means comprises:

offset calculation means for calculating offsets of said first set of nodes;

reflection metals for reflecting the physical positions of said first set of nodes according to said orientation mode;

position calculation means for calculating physical positions of said second set of nodes from said offsets and the reflected physical positions of said first set of nodes; and updating means for updating said physical positions of said second set of nodes.

22. The computer system of claim 21, further comprising display means for displaying the placement of said selected target nodes of the integrated circuit chip design.

23. The system of claim 21, wherein said reflection means includes
- means for reflecting the physical positions of said first set of nodes about the horizontal axis; and
- means for reflecting the physical positions of said first set of nodes about the vertical axis.

24. A computer system for placing logic functions and cells in a floor plan of a design for a very large scale integrated (VLSI) circuit chip based on a set of previously placed logic functions and cells, the VLSI circuit chip design having logic functions composed of cells specified in a logic design hierarchy, the logic design hierarchy being structured as a graph structure, logic functions being represented as non-leaf nodes in the graph and cells being represented as leaf nodes in the graph structure, the graph structure having sub-graphs each having a root node representing a logic function, the floor plan having areas on the VLSI circuit chip called placement regions, the system including an automatic placement system for accepting placement directives, and comprising:
- means for setting an orientation mode, said orientation mode indicating an orientation of physical placement in the floor plan of a logic function or cell;
- source selection means for selecting as selected source nodes at least one source node existing at any level in the logic design hierarchy that has been previously placed in the floor plan;
- target selection means for selecting as selected target nodes at least one target node existing at any level in the logic design hierarchy for placement in the floor plan;
- a source list comprising a list of names of said selected source nodes, pointers to said selected source nodes, and pointers to parent nodes in the logic design hierarchy of said selected source nodes;
- a target list comprising a list of names of said selected target nodes, pointers to said selected target nodes, and pointers to parent nodes in the logic design hierarchy of said selected target nodes;
- comparison means for comparing said source list to said target list to determine if the number of nodes in said source list is the same as the number of nodes in said target list and to determined if the graph structure of the logic design hierarchy of said selected source nodes is similar to the graph structure of the logic design hierarchy of said selected target nodes;
- initialization means for initializing placement directives for said selected target nodes; and
- placement means for placing said selected target nodes of said target list in the floor plan according to the placement of said selected source nodes of said source list and said orientation mode if said comparison means indicates said source list and and target list favorably compare, said placement means further for updating said placement directives of said selected target nodes.

25. The computer system of claim 24 wherein said placement means comprises:
- offset calculation means for calculating offsets of said selected source nodes;
- reflection means for reflecting the physical positions of said selected source nodes according to said orientation mode;
- position calculation means for calculating physical positions of said selected target nodes from said offsets and the reflected physical positions of said selected source nodes;
- updating means for updating said physical positions of said selected target nodes; and
- display means for displaying the placement of said selected target nodes of the VLSI circuit chip design.

26. The system of claim 25, wherein said reflection means includes
- means for reflecting the physical positions of said selected source nodes about the horizontal axis; and
- means for reflecting the physical positions of said selected source nodes about the vertical axis.

27. A computer-aided design system operated by a user to place logic functions and cells in a floor plan of a design for a very large scale integrated (VLSI) circuit chip based on a set of previously placed logic functions and cells, the VLSI circuit chip design having logic functions composed of cells specified in a logic design hierarchy, the logic design hierarchy being structured as a graph structure, logic functions being represented as non-leaf nodes in the graph and cells being represented as leaf nodes in the graph, the graph having-sub-graphs each having a root node representing a logic function, the floor plan having areas on the VLSI circuit chip called placement regions, the computer-aided design system including an automatic placement system for accepting placement directives, and comprising:
- display means for displaying the floor plan of a design;
- input means for receiving user requests;
- processor means coupled to said display means and said input means for processing said user requests; and
- floor planning software means operative on said processor, said floor planning software means including
  - means for setting an orientation mode, said orientation mode indicating an orientation of physical placement in the floor plan of a logic function or cell;
  - source selection means for selecting as selected source nodes at least one source node existing at any level in the logic design hierarchy that has been previously placed in the floor plan;
  - target selection means for selecting as selected target nodes at least one target node existing at any level in the logic design hierarchy for placement in the floor plan;
  - a source list comprising a list of names of said selected source nodes, pointers to said selected source nodes, and pointers to parent nodes in the logic design hierarchy of said selected source nodes;
  - a target list comprising a list of names of said selected target nodes, pointers to said selected target nodes, and pointers to parent nodes in the logic design hierarchy of said selected target nodes;
  - comparison means for comparing said source list to said target list to determine if the number and the graph structure of said selected source nodes is the same as the number and the graph structure of, respectively, said selected target nodes;
  - initialization means for initializing placement directives for said selected target nodes; and
  - placement means for placing said selected target nodes of said target list in the floor plan according to said selected source nodes of said source list and said orientation mode, and for updating said placement directives, said placement means including
    - offset calculation means for calculating offsets of said selected source nodes;
    - reflection means for reflecting the physical positions of said selected source nodes according to said orientation mode; said reflection means including means for reflecting the physical positions of said selected source nodes about the horizontal axis; and means for reflecting the physical positions of said selected source nodes about the vertical axis;

position calculation means for calculating physical positions of said selected target nodes from said offsets and the reflected physical positions of said selected source nodes; and updating means for updating said physical positions of said selected target nodes for subsequent display of said selected target nodes to the user by said display means.

28. In a system for designing an integrated circuit chip, the integrated circuit chip design having logic functions composed of cells, the logic functions and cells being specified as nodes in at least one logic design hierarchy represented as a graph and stored in a database, each of the logic functions and cells being assigned a physical position and an orientation in a floor plan of the integrated circuit chip, the system including an automatic placement system for accepting placement directives, and the floor plan including areas on the integrated circuit chip called placement regions, a computer-implemented method for placing logic functions and cells in a floor plan comprising the steps of:

(a) selecting a first set of nodes in the logic design hierarchy that have been previously placed in the floor plan and previously stored in the database, each of said first set of nodes representing a logic function or a cell;

(b) selecting a second set of nodes in the logic design hierarchy for placement in the floor plan, each of said second set of nodes representing a logic function or a cell;

(c) comparing said first set of nodes to said second set of nodes, and returning to said step (b) when said first set of nodes and said second set of nodes are non-analogous; and (d) assigning a placement to each node in said second set of nodes that is analogous to the placement of a corresponding node in said first set of nodes.

29. The computer-implemented method of claim 28, wherein said assigning step includes assigning a physical position and orientation to each of said second set of nodes according to the physical position and orientation of said corresponding node in said first set of nodes.

30. The computer-implemented method of claim 29, wherein the orientation of said second set of nodes is assigned according to a predetermined orientation mode.

31. The computer-implemented method of claim 28, wherein said assigning step includes assigning a placement region in the floor plan and updating a placement directive for each node in said second set of nodes that is a region-placed node.

32. The computer-implemented method of claim 28, wherein said assigning step includes leaving a node in said second set of nodes unplaced if said corresponding node in said first set of nodes is unplaced.

33. The computer-implemented method of claim 28, wherein said first set of nodes is selected from logic design hierarchies that are different from the logic design hierarchies from which said second set of nodes are selected.

34. The computer-implemented method of claim 28, further including the step of displaying the placement of the nodes in said second set of nodes.

35. The computer-implemented method of claim 28, wherein said comparing step comprises the step of verifying that the number of nodes in said first set of nodes equals the number of nodes in said second set of nodes.

36. The computer-implemented method of claim 35 wherein said comparing step further comprises the step of verifying that nodes in said first set of nodes and nodes in said second set of nodes have analogous hierarchical relationships.

37. The computer-implemented method of claim 28, wherein said assigning step comprises the steps of:

designating as the first root node the node in said first set of nodes which is a root node in the graph representing the logic design hierarchy for said first set of nodes;

designating as the second root node the node in said second set of nodes which is a root node in the graph representing the logic design hierarchy for said second set of nodes;

calculating an offset for said second root node from the physical position of said first root node;

calculating the physical position for each of said nodes in said second set of nodes based on said offset and the physical position of said second root node; and updating the placement location and orientation for each of said nodes in said second set of nodes based on said calculating step.

38. The computer-implemented method of claim 37, wherein the assigning step further includes the step of reflecting said offset for said second root node according to a predetermined orientation mode.

39. The computer-implemented method of claim 38, wherein said reflecting step includes reflecting said offset about the horizontal axis, reflecting said offset about the vertical axis, reflecting said offset about both the horizontal axis and the vertical axis, or not reflecting said offset according to said orientation mode.

* * * * *